(12) United States Patent
Kobayashi

(10) Patent No.: US 7,132,330 B2
(45) Date of Patent: Nov. 7, 2006

(54) NONVOLATILE SEMICONDUCTOR MEMORY DEVICE WITH IMPROVED GATE OXIDE FILM ARRANGEMENT

(75) Inventor: Takashi Kobayashi, Tokorozawa (JP)

(73) Assignee: Renesas Technology Corp., Tokyo (JP)

( * ) Notice: Subject to any disclaimer, the term of this patent is extended or adjusted under 35 U.S.C. 154(b) by 219 days.

(21) Appl. No.: 10/684,379

(22) Filed: Oct. 15, 2003

(65) Prior Publication Data

US 2004/0169250 A1    Sep. 2, 2004

Related U.S. Application Data

(63) Continuation of application No. 09/811,444, filed on Mar. 20, 2001, now Pat. No. 6,759,706.

(30) Foreign Application Priority Data

May 26, 2000    (JP)    ............... 2000-161126

(51) Int. Cl.
*H01L 21/336*    (2006.01)
(52) U.S. Cl. ............ 438/258; 438/142; 438/197; 438/257; 257/E21.689
(58) Field of Classification Search ............ None
See application file for complete search history.

(56) References Cited

U.S. PATENT DOCUMENTS

| 6,143,608 | A | 11/2000 | He et al. |
| 6,259,133 | B1 | 7/2001 | Gardner et al. |
| 6,319,780 | B1 * | 11/2001 | Crivelli et al. |
| 6,327,182 | B1 | 12/2001 | Shum et al. |
| 6,396,108 | B1 * | 5/2002 | Krivokapic et al. |
| 6,410,387 | B1 | 6/2002 | Cappelletti et al. |

FOREIGN PATENT DOCUMENTS

JP    A 10-242310    9/1998

* cited by examiner

*Primary Examiner*—Nathan J. Flynn
*Assistant Examiner*—Kevin Quinto
(74) *Attorney, Agent, or Firm*—Antonelli, Terry, Stout and Kraus, LLP.

(57) ABSTRACT

In a nonvolatile semiconductor memory device, an interpoly dielectric film composed of a nitrogen-introduced CVD $SiO_2$ film is used as the gate oxide films of MOS transistors in a low voltage region of a peripheral circuit region. Gate oxide films of MOS transistors in a high voltage region of the peripheral circuit region are composed of a laminate of the $SiO_2$ film and a nitrogen-introduced CVD $SiO_2$ film. This arrangement improves transistor characteristics and reliability of gate oxide films of the peripheral circuit MOS transistors. It is also possible to realize miniaturization and low voltage operation. Further, simplification of the production process is made possible.

11 Claims, 17 Drawing Sheets

| MEMORY CELL REGION | PERIPHERAL CIRCUIT REGION |
| | LOW VOLTAGE REGION | HIGH VOLTAGE REGION |

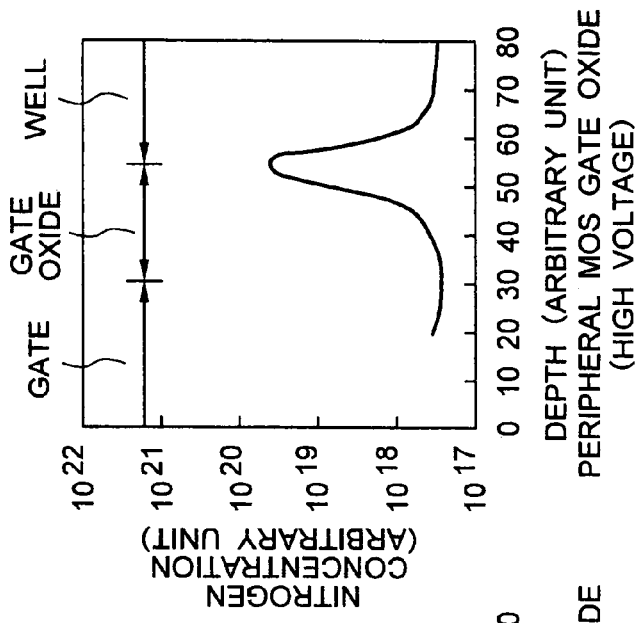
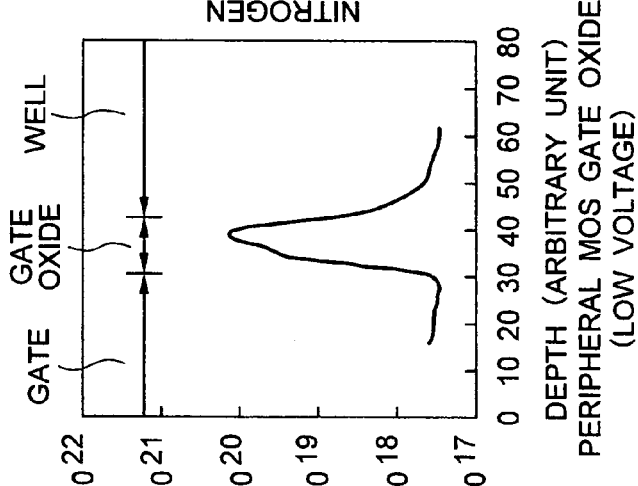
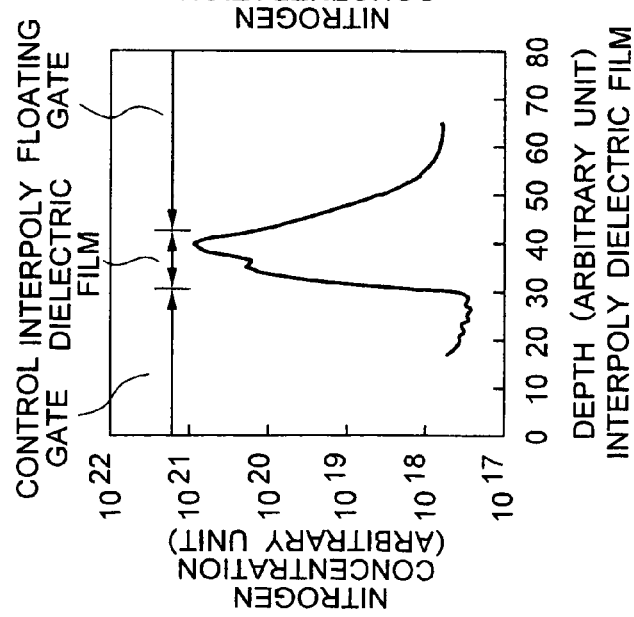

FIG. 9A
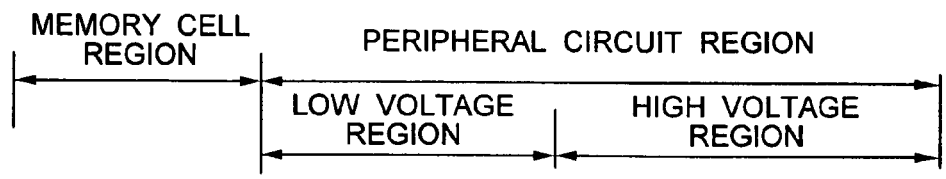
FIG. 9B
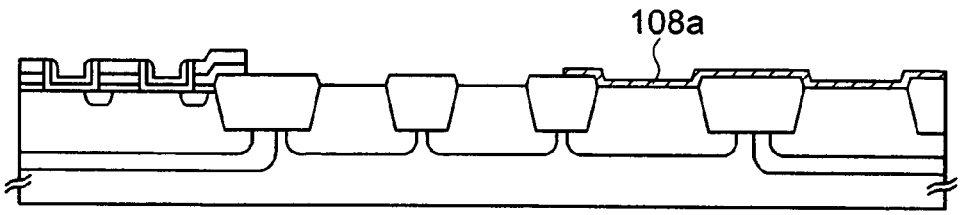
FIG. 9C
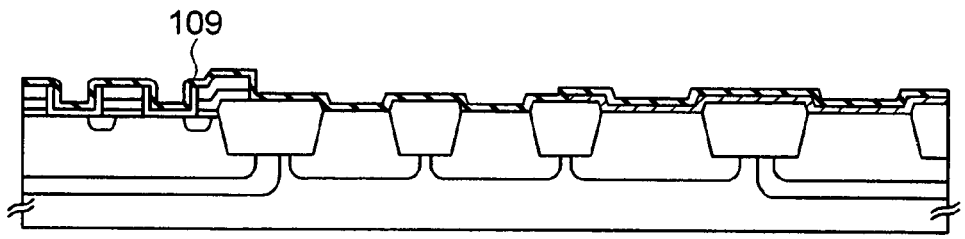
FIG. 9D
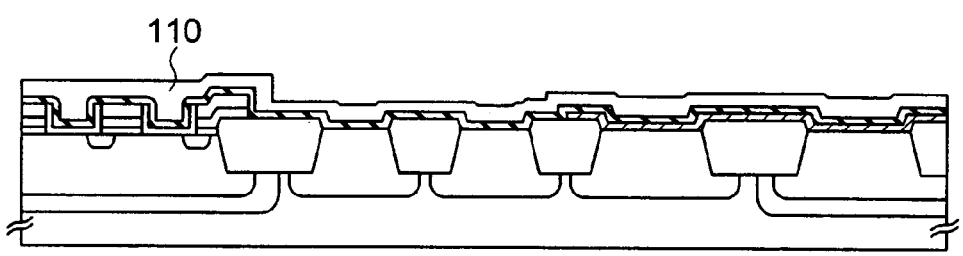
FIG. 9E
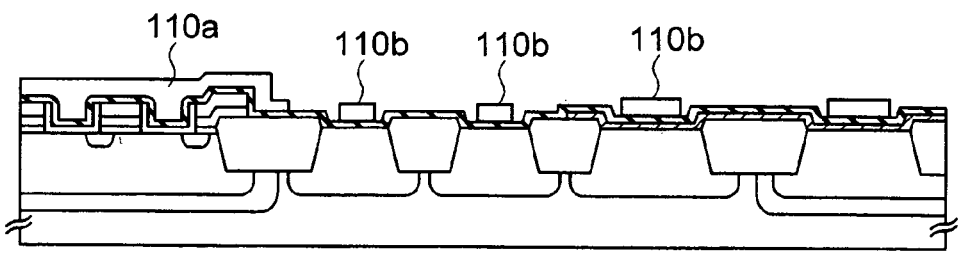
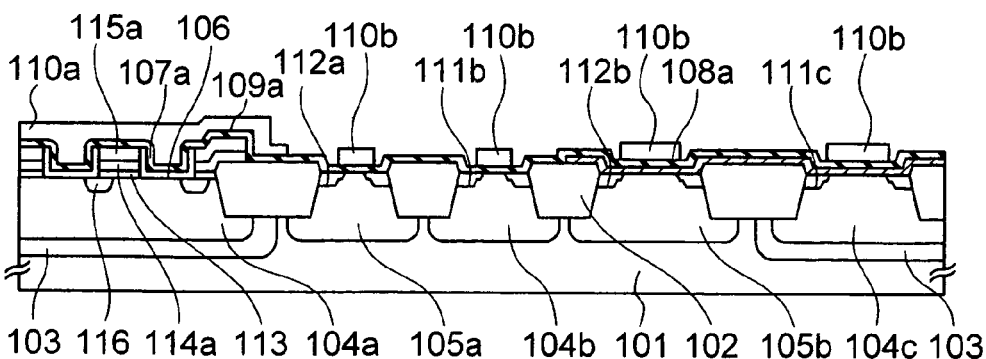

| MEMORY CELL REGION | PERIPHERAL CIRCUIT REGION | |
|---|---|---|
| | LOW VOLTAGE REGION | HIGH VOLTAGE REGION |

FIG. 12A
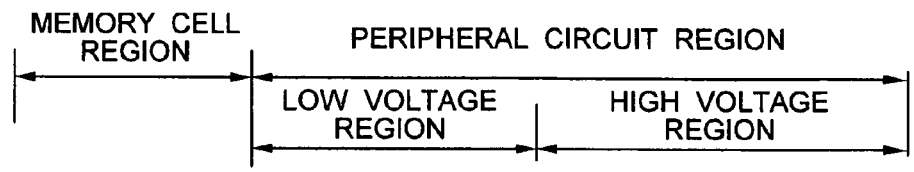
FIG. 12B
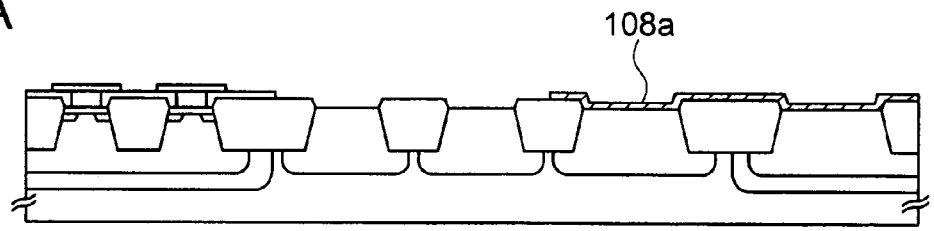
FIG. 12C
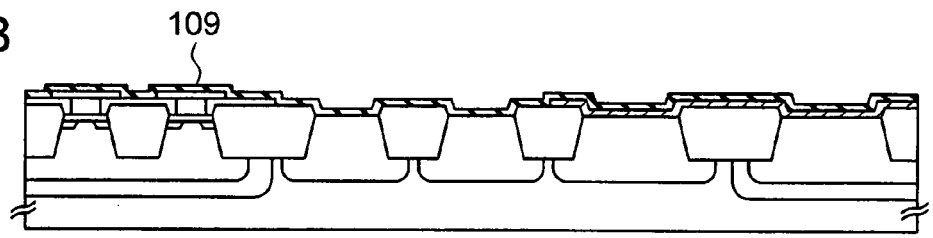
FIG. 12D
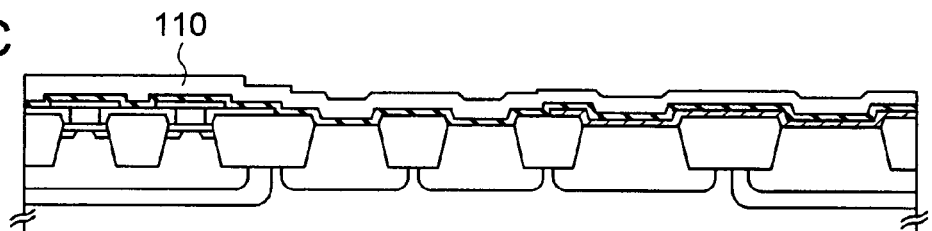
FIG. 12E
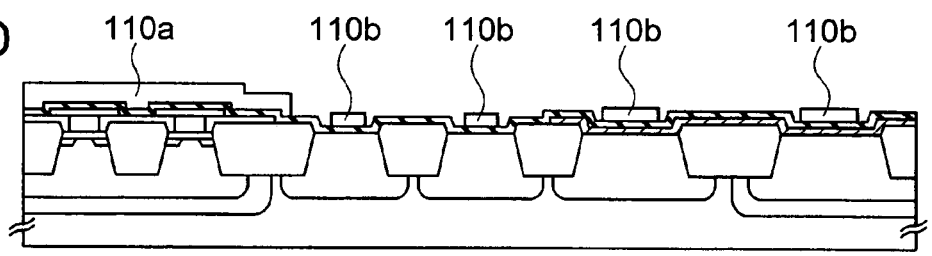
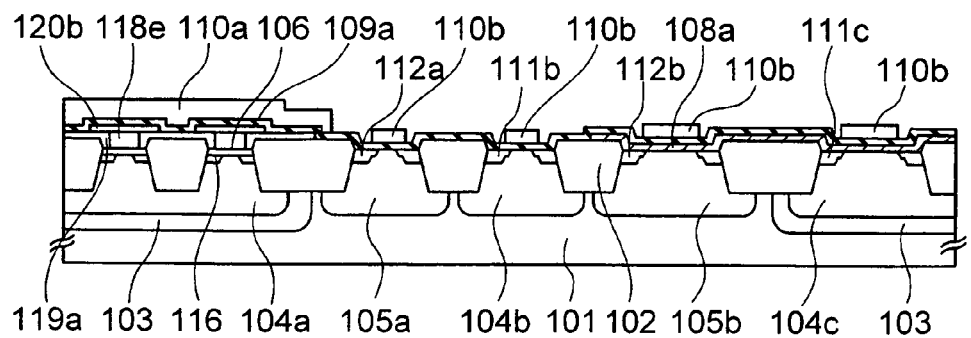

FIG. 15A
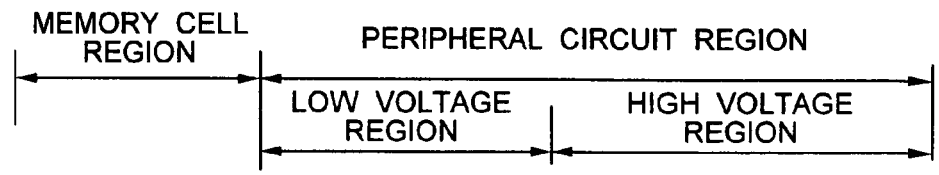
FIG. 15B
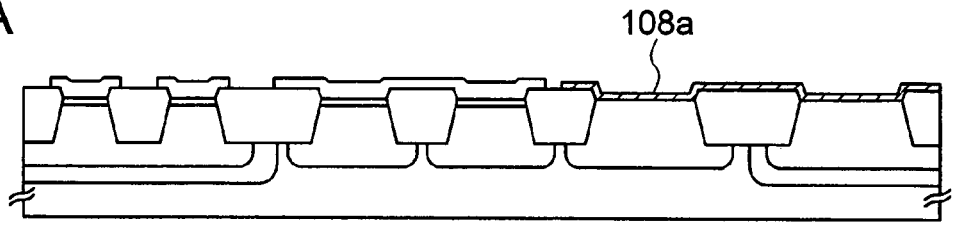
FIG. 15C
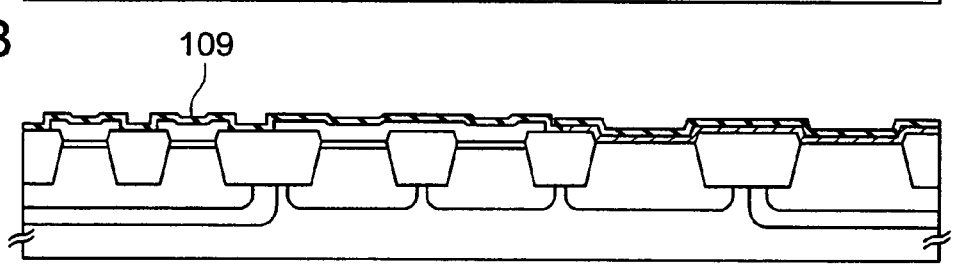
FIG. 15D
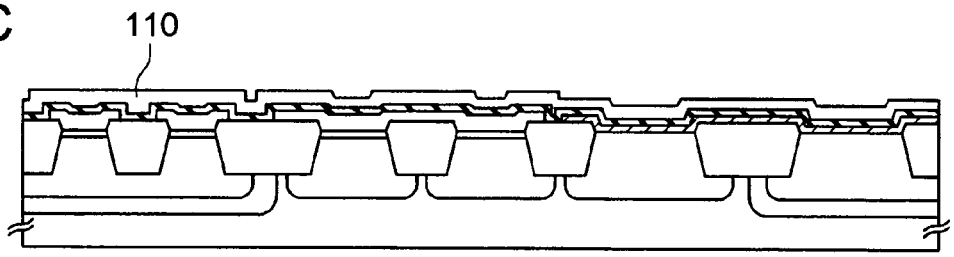
FIG. 15E
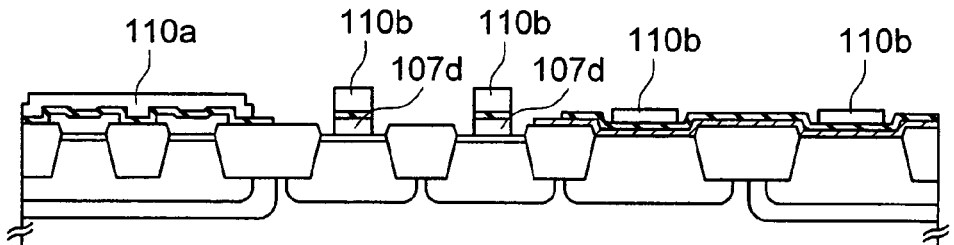
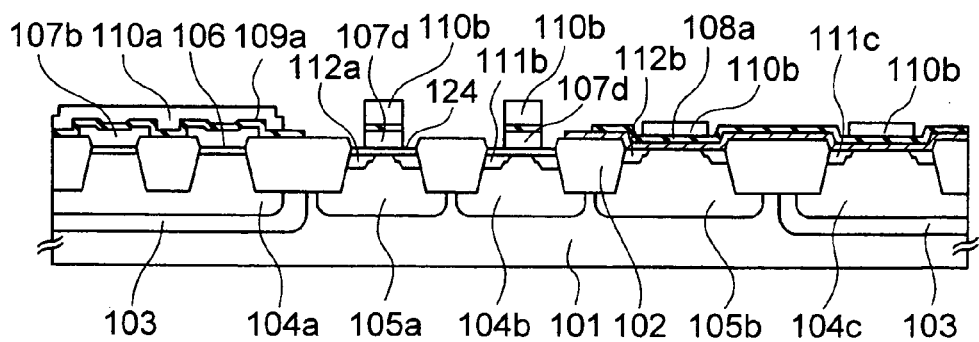

| MEMORY CELL REGION | PERIPHERAL CIRCUIT REGION |
| | LOW VOLTAGE REGION | HIGH VOLTAGE REGION |

| MEMORY CELL REGION | PERIPHERAL CIRCUIT REGION | |
|---|---|---|
| | LOW VOLTAGE REGION | HIGH VOLTAGE REGION |

NONVOLATILE SEMICONDUCTOR MEMORY DEVICE WITH IMPROVED GATE OXIDE FILM ARRANGEMENT

CROSS-REFERENCE TO RELATED APPLICATIONS

This application is a Continuation application of application Ser. No. 09/811,444, filed Mar. 20, 2001 now U.S. Pat. No. 6,759,706, the entire disclosure of which is hereby incorporated by reference.

FIELD OF THE INVENTION

The present invention relates to a nonvolatile semiconductor memory device and a process for producing the device, and it specifically pertains to the techniques for realizing miniaturization, low voltage operation, high reliability and simplified production process of the device.

BACKGROUND OF THE INVENTION

Flash memory, which is a typical example of nonvolatile semiconductor memory device, is rapidly expanding its market as a memory unit for small-sized portable information devices such as cellular phones, digital still cameras, etc., as it is handy to carry, shock-proof and also capable of electrical bulk erasing on board.

This flash memory, as for instance illustrated in FIG. 18, usually consists of memory cells M which store data and MOS field effect transistors P constituting peripheral circuits for selecting the programming/erasing or read bits or generating a necessary voltage in the chips.

Unitary memory cell M comprises a set of MOS field effect transistors each consisting of a silicon (Si) substrate 201 having source and drain diffusion layers (not shown), a P well 204a formed on said Si substrate, a floating gate 207 and a control gate 209 both of which comprise mainly a polycrystalline Si film, an interpoly dielectric film 208 separating said gates 207 and 209, and a tunnel dielectric film 206 separating said floating gate 207 and P well 204a, and a plurality of such memory units are arranged as a matrix. As the interpoly dielectric film separating the floating and control gates of each memory cell, there is usually used a so-called ONO film which is a stacked film comprising a silicon nitride (Si3N4) film sandwiched between the $SiO_2$ films, said ONO film being higher in permittivity and smaller in leakage current than the $SiO_2$ film.

Peripheral circuit P consists of a combination of MOS field effect transistors each comprising a P well 204b and an N well 205 formed in an Si substrate 201, source and drain diffusion layers 212a and 212b, and a gate electrode 211 mainly comprising a polycrystalline Si film formed on the well with the interposition of a gate insulating film 210. Gate insulating film 210 usually comprises a $SiO_2$ film formed by thermal oxidation method.

Each unitary memory cell M and peripheral circuit transistors P are usually separated by an isolation region 202 comprising a thick oxide film. The quantity of charge accumulated in the floating gate is controlled by biasing the positive or negative voltage generated by the peripheral circuit to the control gate 209, and the threshold voltage of the memory cell transistors is varied accordingly to thereby discriminate "0" and "1" of data.

However, increase of density of said nonvolatile semiconductor memory device has given rise to the new problems over the MOS transistors P for peripheral circuits and the memory cells M.

One of such problems is deterioration of characteristics and reliability of the MOS transistors for peripheral circuits due to degradation of the gate oxide film.

In flash memory, a high voltage, such as, for example, 18 V, is applied to the word line at writing/erasing. For the MOS transistors for peripheral circuits exposed to such high voltage, the gate oxide film thickness is increased to, for instance, around 25 nm so that the film can withstand such high voltage. However, in case the shallow groove isolation method is applied in place of the conventional selective oxidation method (LOCOS) for isolation between the peripheral MOS transistors for the purpose of miniaturization of the elements, if the thick (such as 25 nm) gate oxide film is formed by the thermal oxidation method, there arises a situation in which the thickness of the gate oxide film adjacent to the shallow groove isolation region becomes excessively small in comparison with the active region. This gives rise to some serious problems such as "kink" of current-voltage characteristics of the MOS transistors and lowering of breakdown voltage of the gate oxide film.

The second problem is difficulty in thinning of the interpoly dielectric film of the memory cells M which is essential for the reduction of programming voltage.

The voltage Vfg applied to the floating gate for the programming/erasing operation of the flash memory is given by the following equation:

$$Vfg = C2 \cdot Vcg / (C1 + C2) \quad (1)$$

wherein Vcg is voltage applied to the control gate, and C1 and C2 are capacitance of the tunnel dielectric film and the interpoly dielectric film, respectively. In order to transfer the voltage applied to the control gate efficiently to the floating gate to reduce the programming voltage, it is effective to increase C2, namely to make thinner the interpoly dielectric film. However, in the case of the "ONO film", i.e. a stacked film comprising a silicon nitride (Si3N4) film sandwiched between the $SiO_2$ films, which has been widely used in the art, if the thickness of the $SiO_2$ film on each side of the laminate is made 5 nm or less, there would arise the problem that the charge accumulated in the floating gate might leak out to the control gate, that is, actualization of so-called retention degradation. Also, when the $SiO_2$ film on the upper side of the laminate is made 5 nm in thickness, it is necessary to deposit the Si3N4 film to a thickness of around 10 nm or greater for preventing oxidation of the polycrystalline Si layer on the lower side. Thus, the limit of possible reduction of thickness of the ONO film was around 15 nm in terms of effective oxide thickness.

JP-A-10-242310 discloses a technique for reducing the programming voltage by lessening the film thickness by applying a nitrogen-introduced single-layer CVD $SiO_2$ film as the interpoly dielectric film in place of the conventional ONO film.

However, when the gate oxide film of the peripheral circuit MOS transistors was formed by the thermal oxidation method after forming the interpoly dielectric film, as commonly practiced in manufacture of the conventional flash memories, there would arise the problem that the highly doped floating gate polycrystalline Si be oxidized thickly because the single-layer CVD $SiO_2$ film has no oxidation resistance unlike the ONO film. Therefore, development of a reliable method for forming a gate oxide film of the peripheral circuit MOS transistors when using a single-layer CVD $SiO_2$ film as the interpoly dielectric film for memory cell was essential.

The third problem is the increase of the number of the steps in the production process.

In the conventional flash memory production process, the tunnel dielectric film 206 of memory cells, their interpoly dielectric film 208 and the gate insulating film 210 of peripheral circuit MOS transistors have been formed severally in succession, so that the process involved many steps and this has been an obstacle to the effort for cost reduction. Recently, an idea of the techniques for making two type thickness of the gate oxide film of MOS transistors in the peripheral circuit region is proposed for attaining further enhancement of programming/erasing speed and read speed of the flash memory. It is considered that the simplification of the flash memory production process will become an important subject for study in the art.

The above-said three problems are closely associated with each other from the viewpoint of formation of interpoly dielectric films of memory cells and gate oxide film of peripheral circuit MOS transistors, and for the solution of these problems, the development of a novel nonvolatile semiconductor memory device and its production process has been required.

Accordingly, an object of the present invention is to make highly reliable the gate oxide film of peripheral circuit MOS transistors of nonvolatile semiconductor memory device and to improve its transistor characteristics.

Another object of the present invention is to provide a process for forming the interpoly dielectric film and the gate oxide film of MOS transistors in the peripheral circuit region that accord with the miniaturization and low-voltage operation of nonvolatile semiconductor memory device.

Still another object of the present invention is to simplify the production process of nonvolatile semiconductor memory device.

SUMMARY OF THE INVENTION

In the nonvolatile semiconductor memory device of the present invention, in order to solve the first problem mentioned above, the gate insulating film of MOS field effect transistors composing the peripheral circuit is formed by an insulating film, for example, a CVD $SiO_2$ film, deposited on a semiconductor substrate. This can eliminate thinning of the thickness of the gate oxide film at the part adjoining to the shallow groove isolation region even when using the shallow groove isolation method for the isolation between the MOS field effect transistors, making it possible to prevent "kink" of the MOS field effect transistor characteristics. This also allows avoidance of lowering of breakdown voltage of the gate oxide film. It is noticeable that in case the peripheral circuit is constituted by MOS field effect transistors having two or more different gauges of gate insulating film thickness, an especially significant effect is produced when the above-said insulating film is applied to the high voltage MOS field effect transistors with a greater gate insulating film thickness.

Also, by using a stacked film (e.g. CVD $SiO_2$ film) comprising an insulating film formed by thermally oxidizing the semiconductor substrate surface and another insulating film deposited on the first-said insulating film as the gate insulating film of MOS field effect transistors of peripheral circuit, it is possible to compensate the thickness of the gate oxide film at the part adjacent to the shallow groove isolation region with the deposited insulating film, so that as in the above-said case using a single-layer deposited insulating film, it becomes possible to prevent kink of the MOS field effect transistor characteristics and to avoid lowering of breakdown voltage of the gate oxide film. In this case, it is preferable for producing the desired effect to make the thickness of the deposited insulating film greater than that of the insulating film formed by thermal oxidation.

In order to solve the above-said second problem, in the nonvolatile semiconductor memory device production process of the present invention, the gate insulating film of MOS field effect transistors constituting the peripheral circuit is formed by an insulating film, for example, CVD $SiO_2$ film, deposited on a semiconductor substrate. By this measure, even when a CVD $SiO_2$ film is used as the interpoly dielectric film and the gate insulating film is formed after forming the interpoly dielectric film, it is possible to prevent the said interpoly dielectric film (CVD $SiO_2$ film) from being oxidized thickly.

In case the whole or part of the gate insulating films of peripheral circuit are made of a film formed by thermal oxidation, it is possible to prevent abnormal oxidization of the interpoly dielectric film, or CVD $SiO_2$ film, by finishing the step of thermal oxidation of the semiconductor substrate surface prior to the step of forming the interpoly dielectric film.

For solving the above-said third problem, in the nonvolatile semiconductor memory device and its production process according to the present invention, the insulating film (for example, CVD insulating film) deposited for forming the interpoly dielectric film is used as the whole or part of the gate insulating films of MOS field effect transistors.

BRIEF DESCRIPTION OF THE DRAWINGS

FIG. 6 is the graphs showing distribution of nitrogen concentration in the $SiO_2$ film.

FIG. 9 is schematic sectional illustrations (3) of Example 2 of the present invention.

FIG. 12 is schematic sectional illustrations (3) of Example 3 of the present invention.

FIG. 15 is schematic sectional illustrations (2) of Example 5 of the present invention.

DESCRIPTION OF REFERENCE NUMERALS

Figure 1A:
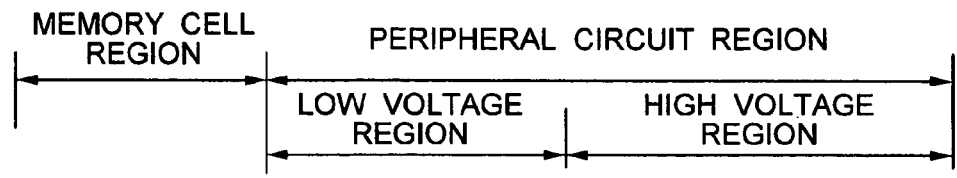
FIG. 1 is schematic sectional illustrations (1) of Example 1 of the present invention.

101: Si substrate; 102: shallow groove isolation region; 103: well isolation region; 104a, 104b, 104c: P wells; 105a, 105b: N wells; 106: thermal oxide film; 107, 107a, 107b, 107c, 107d, 107e, 107f: phosphorus-doped polycrystalline Si film; 108, 108a, 109, 109a: nitrogen-introduced $SiO_2$ film; 110, 110a, 110b: phosphorus-doped polycrystalline Si film; 111a, 111b, 111c: N source/drain region; 112a, 112b: P source/drain region; 113: thermal oxide film; 114, 114a: phosphorus-doped polycrystalline Si film; 115, 115a: $SiO_2$ film; 116: source/drain region; 117: photoresist; 118, 118a, 118b, 118c, 18d, 118e: phosphorus-doped polycrystalline Si film; 119, 119a: $SiO_2$ film; 120, 120a, 120b: phosphorus-doped polycrystalline Si film; 121: $SiO_2$ film; 122: $Si3N4$ film; 123, 123a: thermal oxide film; 124, 124a: thermal oxide film; 125, 125a: nitrogen-introduced $SiO_2$ film; 126, 126a: thermal oxide film; 200: gate oxide film; 201: Si substrate; 202: oxide film for isolation; 203: well isolation region; 204a, 204b: P wells; 205: N well; 206: thermal oxide film; 207: phosphorus-doped polycrystalline Si film; 208: ONO interpoly dielectric film; 209: phosphorus-doped polycrystalline Si film; 210: thermal oxide film; 211: phosphorus-doped polycrystalline Si film; 212a, 212b: source/drain region; M: memory cell; P, P': MOS transistors.

DETAILED DESCRIPTION OF THE INVENTION

EXAMPLE 1

In this example, a nitrogen-introduced CVD $SiO_2$ film was used as the interpoly dielectric film of memory cells of nonvolatile semiconductor memory device and as the gate oxide film of peripheral circuit MOS transistors. By forming these films simultaneously, it was tried to attain improvement of peripheral circuit MOS transistor characteristics, miniaturizing of memory cells, reduction of operating voltage and simplification of the production process.

The procedure of producing the nonvolatile semiconductor memory device of this Example is shown in FIGS. 1 and 2. This nonvolatile semiconductor memory device comprises a memory cell region in which a plurality of data-accumulating memory cells are arranged matrix-wise and a peripheral circuit region where a plurality of MOS transistors constituting peripheral circuits operative to select programming/erasing and read bits and to generate necessary voltage in the chips are disposed.

The peripheral circuit region is divided into a low voltage region where only a relatively low voltage such as supply voltage of, for example, 3.3V is applied and a high voltage region where a high voltage, such as 18 V, necessary for programming/erasing is applied. The low voltage region and the high voltage region are both comprised of a plurality of NMOS transistors and PMOS transistors formed on the P wells 104b, 104c and the N wells 105, 105b, respectively. Memory cells are the typical flash memories called NOR type, which are formed on the corresponding P wells 104a.

FIGS. 1 and 2 show the sectional views parallel to the word lines of memory cells and perpendicular to the gate lines of peripheral circuit MOS transistors.

The production process is described below.

First, shallow groove isolation regions 102 separating memory cells and peripheral circuit MOS transistors were formed on a p-type Si substrate 101 with surface orientation (100) (FIG. 1(a)).

Figure 1B:
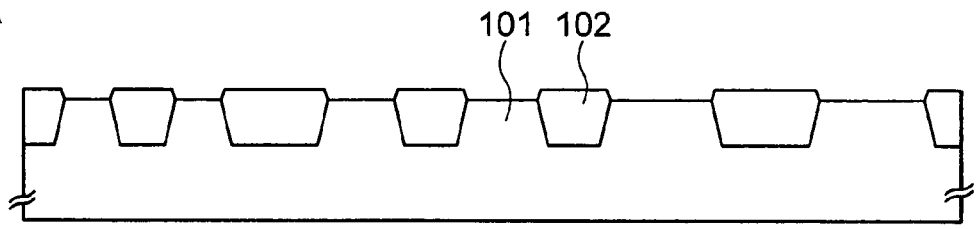

Then, P well regions 104a, 104b, 104c, N well regions 105a, 105b and isolation regions 103 were formed by ion implantation method (FIG. 1(b)).

Figure 1C:
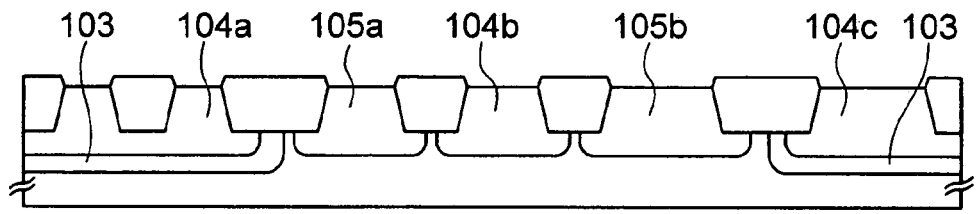

Next, $SiO_2$ film 106 functioning as a tunnel dielectric film of each memory cell was formed to a thickness of 9 nm by thermal oxidation method (FIG. 1(c)).

Figure 1D:
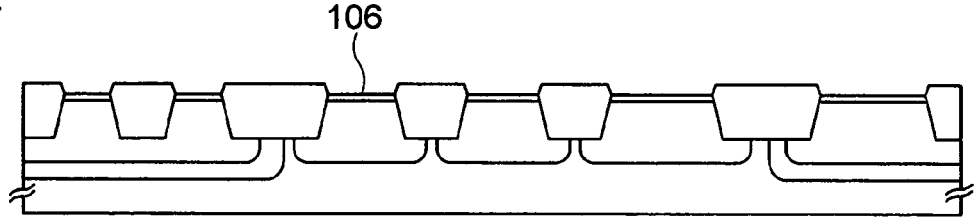

This was followed by 150 nm deposition of a phosphorus-doped polycrystalline Si film which proves a floating gate (FIG. 1(d)).

Said polycrystalline Si film 107 was patterned by lithography and drying etching (polycrystalline Si film 107 becomes 107a). By this operation, polycrystalline Si film 107 and $SiO_2$ film 106 in the peripheral circuit region were perfectly eliminated (FIG. 1(e)).

Next, $SiO_2$ film 108 was deposited to a thickness of 16 nm by low pressure chemical vapor deposition (LPCVD) method using SiH4 and N2O as source gases. Deposition temperature was 750° C. Immediately thereafter, $SiO_2$ film 108 was annealed in an NH3 atmosphere, followed by wet oxidation (FIG. 1(f)).

Figure 2A:
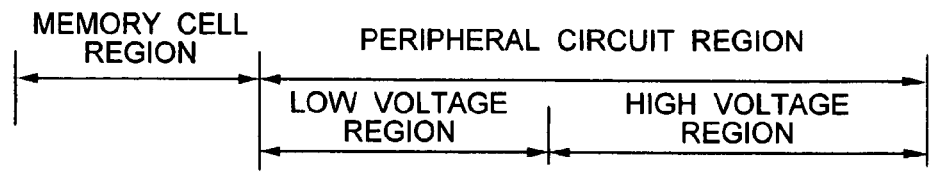
FIG. 2 is schematic sectional illustrations (2) of Example 1 of the present invention.
Figure 2B:
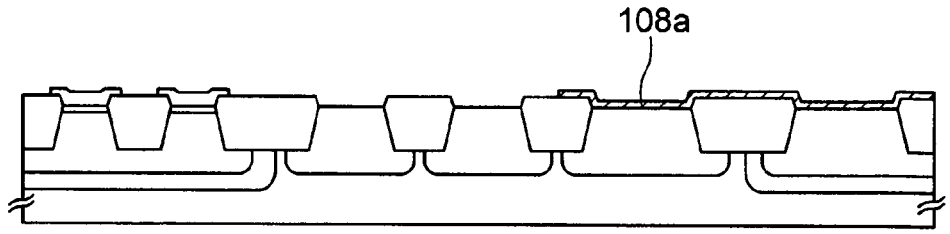

Then, a resist pattern was formed by lithography in such a manner that the high voltage region alone in the peripheral circuit region would be covered (not shown), after which $SiO_2$ film 108 existing in the low voltage region alone in the memory cell region and peripheral circuit region were removed ($SiO_2$ film 108 becoming 108a) by a mixed aqueous solution of hydrogen fluoride and ammonia (FIG. 2(a)).

Thereafter, $SiO_2$ film 109 was again deposited to a thickness of 11 nm by LPCVD using SiH4 and N2O as source gases. Deposition temperature was 750° C. Immediately thereafter, $SiO_2$ film 109 was annealed in an NH3 atmosphere and subjected to wet oxidation (FIG. 2(b)).

Thus, by the steps shown in FIG. 1(f) to FIG. 2(b), there are formed a 11 nm thick interpoly dielectric film (CVD $SiO_2$ film 109) in the memory cell region, a 11 nm thick gate oxide film (CVD $SiO_2$ film 109) in the low voltage region of the peripheral circuit region, and an approximately 27 nm thick gate oxide film (laminate of CVD $SiO_2$ film 108a and CVD $SiO_2$ film 109) in the high voltage region of the peripheral circuit region. Here, the deposited CVD $SiO_2$ film is annealed in an NH3 atmosphere and then subjected to wet oxidation for the purpose of reducing the defect in the film called "E' center" and the hydrogen atoms. This helps to minimize leakage current of the insulating films while reducing trap, thereby improving retention capability of the memory cells. The above operation is also envisaged to improve transconductance of peripheral circuit MOS transistors.

Figure 2C:
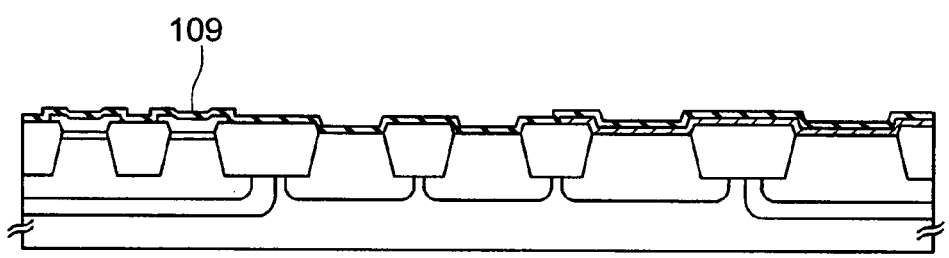

Then, phosphorus doped polycrystalline Si film 110 designed to serve as a control gate of each memory cell and gate electrodes of peripheral circuit was deposited (FIG. 2(c)).

Thereafter, polycrystalline Si film 110 was patterned by lithography and drying etching to form the control gate (word line) of each memory cell and gate electrodes 110b of peripheral circuit. After this, though not shown in the drawings, $SiO_2$ film 109 and polycrystalline Si film 107a in the memory cell region were etched to form a floating gate ($SiO_2$ film 109 becomes 109a and polycrystalline Si film 107a becomes 107a) (FIG. 2(d)).

Figure 2D:
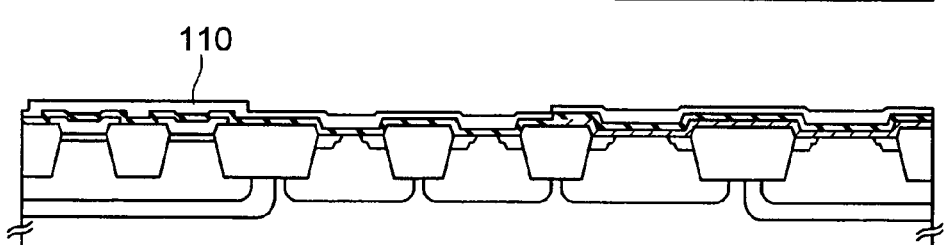
Figure 2E:
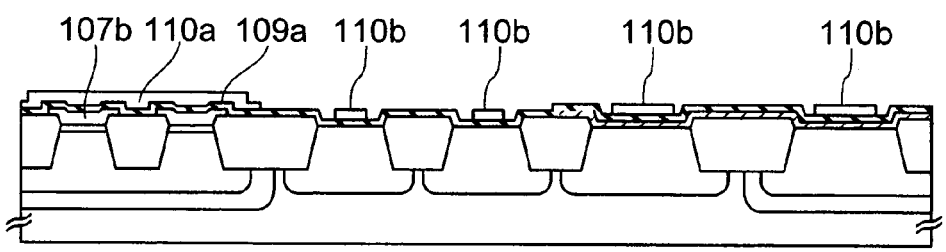

Then, source/drain regions 111b, 111c, 112a, 112b of peripheral circuit MOS transistors and those of memory cells (not shown) were formed by ion implantation method (FIG. 2(e)).

Thereafter, though not shown in the drawings, an inter-metal insulating film was deposited, and in this film contact holes connecting to word line 110a, gate electrodes 110b of MOS transistors of the peripheral circuit region and source/drain regions 112, 111 were formed. Then a metal film was deposited and patterned to form electrodes, thereby completing a nonvolatile semiconductor memory device.

Figure 3:
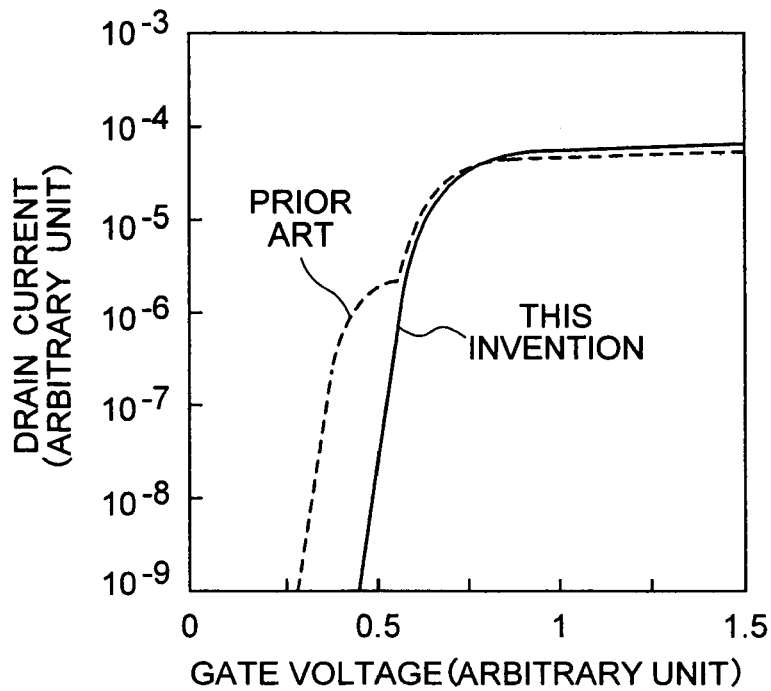
FIG. 3 is a graph showing the relation between gate voltage and gate current.

FIG. 3 shows the relation between gate voltage and drain current of high voltage MOS transistors in the peripheral circuit region formed according to the process of the present invention. For the comparison's sake, there is also shown the result obtained when the gate oxide film of MOS transistors was formed by thermal oxidation method. In each case, the gate oxide film thickness was 28 nm. In the case of prior art using thermal oxidation method, a bump called kink was observed in the current/voltage characteristics, indicating characteristic degradation of the device. In contrast, in the case of the present invention using nitrogen-introduced CVD $SiO_2$ film, good current/voltage characteristics were obtained.

Figure 4:
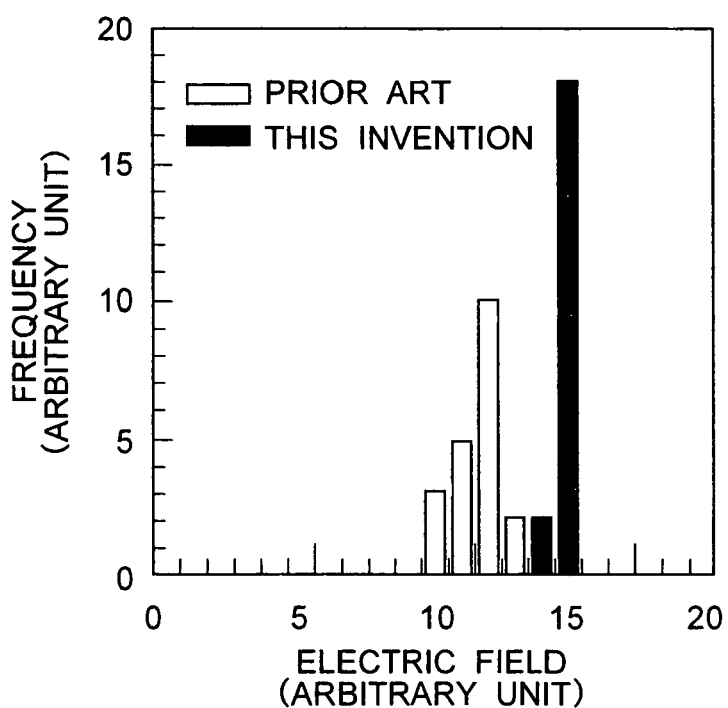
FIG. 4 is a graph showing distribution of breakdown voltage of the gate oxide film.

FIG. 4 shows the results of determination of breakdown voltage of the gate oxide films of high voltage MOS transistors in the peripheral circuit region formed by the method of the present invention and the conventional thermal oxidation method. As is seen from FIG. 4, it was revealed that breakdown voltage could be increased by using nitrogen-introduced CVD $SiO_2$ film as gate oxide film in place of the film formed by thermal oxidation.

Figure 5A:
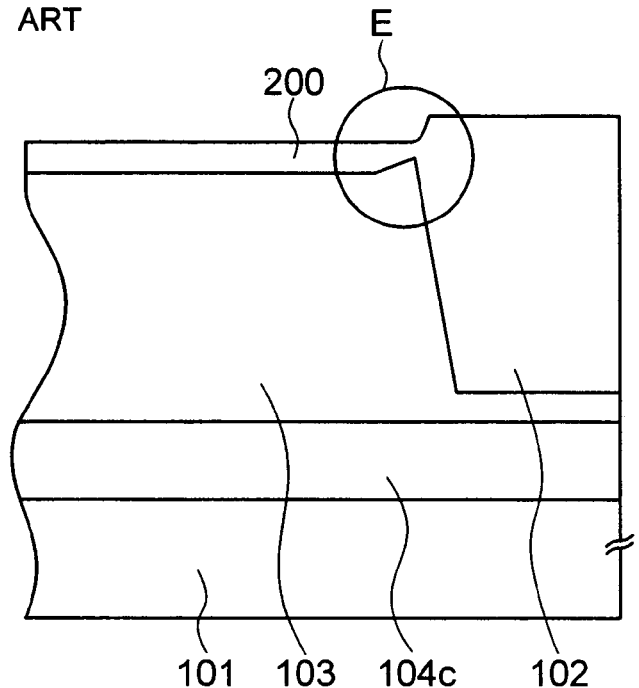
FIG. 5 shows geometries of the gate oxide film in the vicinity of the shallow groove isolation region.
Figure 5B:
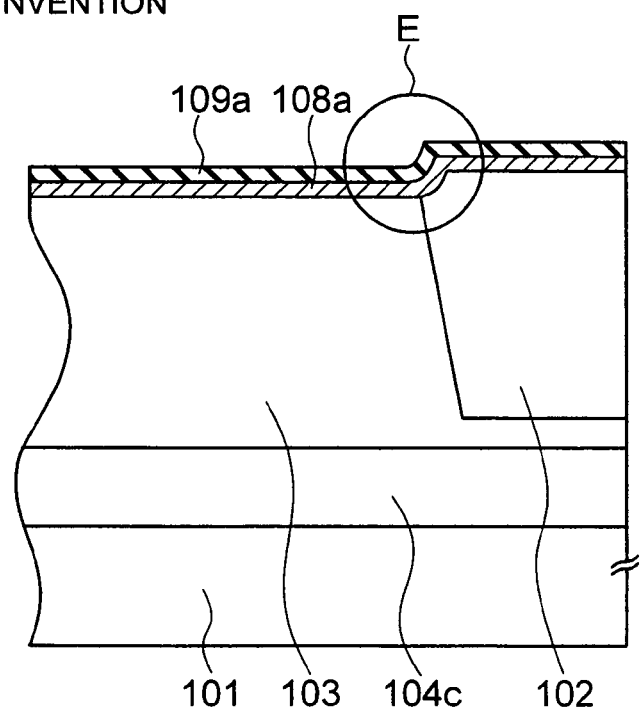

For clarifying the difference in characteristics between the prior art and the present invention illustrated in FIGS. 3 and 4, a sectional structure of a high voltage MOS transistor according to the prior art and that of the present invention were observed under a scanning transmission electron microscope. Results are shown in FIG. 5. In the case of the prior art using a thermal oxidation film 200 as gate oxide film, the thickness of gate oxide film at the part contiguous to the shallow groove isolation region indicated by a circle E is remarkably reduced as compared to the central part of the active region (FIG. 5(a)). It was found that this local thinning of the gate oxide film was responsible for the degradation of current/voltage characteristics or the reduction of breakdown voltage. In contrast, in the case of the present invention using a nitrogen-introduced CVD $SiO_2$ film, thinning of the gate oxide film near the shallow groove isolation region, which took place when using the thermal oxidation film, was not induced (FIG. 5(b)), and this led to the obtainment of good characteristics.

In application of CVD $SiO_2$ film to peripheral circuit MOS transistors, nitrogen introduction to such a film is of much account. In the production of the nonvolatile semiconductor memory devices illustrated in FIGS. 1 and 2, in case no annealing was conducted in ammonia and also nitrogen was not introduced in forming the CVD $SiO_2$ films 108 and 109, there was seen a notable reduction of transconductance in MOS transistors in both low voltage and high voltage regions of the peripheral circuit region vis-à-vis the case where nitrogen was introduced. Breakdown voltage of the gate oxide film also lowered.

In Example 1 of the present invention, the interpoly dielectric film of memory cells and the gate oxide film of low voltage MOS transistors in the peripheral circuit region are formed by a completely same step. Therefore, 4 types of gate insulating film including tunnel oxide film of memory cell can be actually provided by 3 types of film. This allows a reduction of the number of the production steps over the case where the gate insulating films are formed independently of each other.

FIG. 6 shows the results of determination, by secondary ion mass spectroscopy, of nitrogen distribution in the interpoly dielectric film of memory cell and in the gate oxide films of both low voltage and high voltage MOS transistors in the peripheral circuit region of the nonvolatile semiconductor memory device produced by the method illustrated in FIGS. 1 and 2. Although the interpoly dielectric film and the gate oxide films of low voltage and high voltage MOS transistors were formed by a same step, the interpoly dielectric film was highest in nitrogen concentration, followed by the low voltage region gate oxide film and the high voltage region gate oxide film in this order. This can be accounted for by the fact that the amount of nitrogen introduced into the $SiO_2$ film increases with the rise of impurity concentration in the base Si layer.

JP-A-11-87545 discloses the techniques for forming the gate oxide film of MOS transistors in the peripheral circuit region with a laminate of a tunnel oxide film of memory cell and an interpoly dielectric film both of which were formed by CVD. This method, however, had the problem that since the thickness of gate oxide film of peripheral circuit transistors is decided by the sum of thicknesses of two oxide films of memory cell, there is no freedom for the setting of film thickness. Degradation of film characteristics was also a matter of concern with this method because the tunnel oxide film which incurred damage during patterning of the floating gate is used as it is for the gate oxide film of peripheral circuit transistors. The method according to the instant Example of the present invention has the advantage in that the thickness of gate oxide film of high voltage MOS transistors in the peripheral circuit region can be optionally set by properly changing the thickness of $SiO_2$ film 108. Further, because of use of wet etching for patterning of $SiO_2$ film 108, there is no possibility of suffering degradation of film characteristics due to damage.

As described above, Example 1 of the present invention has the effect of improving characteristics and reliability of MOS transistors in the peripheral circuit region of a nonvolatile semiconductor memory device. With regard to such improvement of characteristics and reliability of peripheral circuit MOS transistors, it is not an essential requirement that the whole (low voltage region) or part (high voltage region) of gate insulating films of peripheral circuit MOS transistors be formed by the same step as the interpoly dielectric film of memory cell; they may be the insulating films, for example, CVD $SiO_2$ films, formed by deposition. Also, according to the present Example of the invention, it is possible to embody a nonvolatile semiconductor memory device production process which enables miniaturizing of the memory cells and lowering of operating voltage. Further, two types of gate oxide films of peripheral circuit MOS transistors can be made without increasing the number of the production steps.

EXAMPLE 2

This Example concerns another instance of attempt for realizing improvement of characteristics of peripheral circuit MOS transistors, miniaturizing of memory cells, reduction of operating voltage and simplification of production process, featuring use of nitrogen-introduced CVD $SiO_2$ film for both of the interpoly dielectric film of memory cells and gate oxide film of peripheral circuit MOS transistors of a nonvolatile semiconductor memory device and simultaneously formation of these films.

The production procedure of the nonvolatile semiconductor memory device according to the instant Example is shown in FIGS. 7 to 9, each of which gives sectional illustrations parallel to the word lines of memory cells and perpendicular to the gate lines of peripheral circuit MOS transistors. What is different from Example 1 is that there exists no isolation region separating the cells in the memory cell region, that the memory cells are of a so-called virtual ground type in which the adjoining memory cells share the same source and drain, and that each memory cell has a third gate 114a (hereinafter referred to as assist gate) which is different from the floating and control gates. This assist gate 114a is embedded between floating gates 107b and has a function to increase the hot electron injection efficiency during programming. It also functions to separate the adjoining memory cells on application of 0 V to the gate. This Example, therefore, enables a reduction of the memory cell area as compared with the ordinary NOR type cells of Example 1, and is also capable of simultaneous writing operation with plural cells to improve the programming throughput. It is therefore suited for enlargement of memory density.

The production process of the nonvolatile semiconductor memory device according to this Example is described below.

Figure 7A:
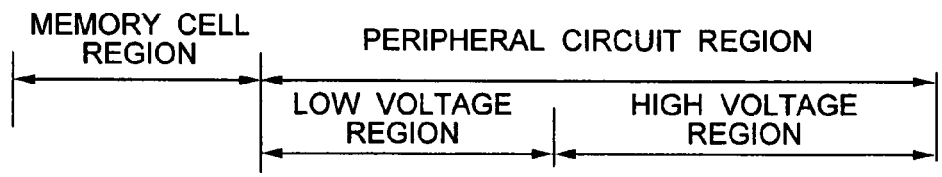
FIG. 7 is schematic sectional illustrations (1) of Example 2 of the present invention.

First, shallow groove isolation regions 102 separating MOS transistors in the peripheral circuit region were formed on a p-type Si substrate with surface orientation (100) (FIG. 7(a)).

Figure 7B:
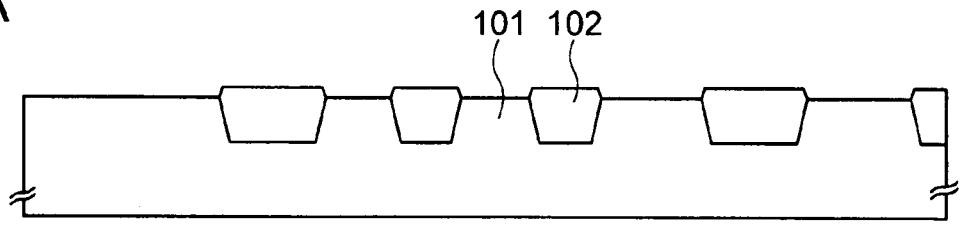

Then, P well regions 104a, 104b, 104c, N well regions 105a, 105b, and isolation regions 103 separating the wells were formed by ion implantation method (FIG. 7(b)).

Figure 7C:
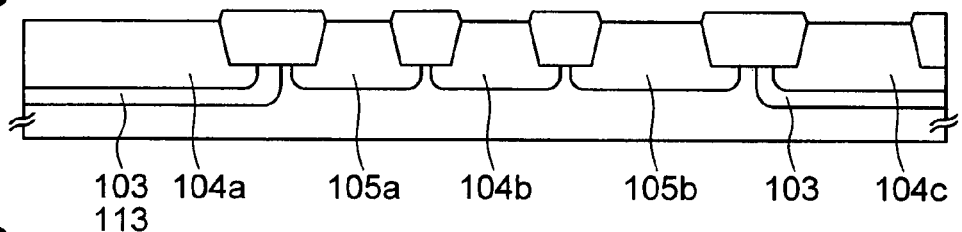

Next, a $SiO_2$ film 113, which is to serve as a gate oxide film beneath the assist gate, was formed to a thickness of 9 nm by thermal oxidation method (FIG. 7(c)).

Figure 7D:
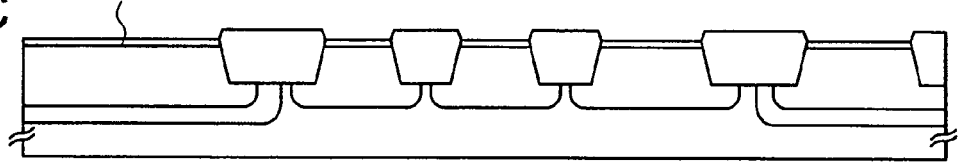
Figure 7E:
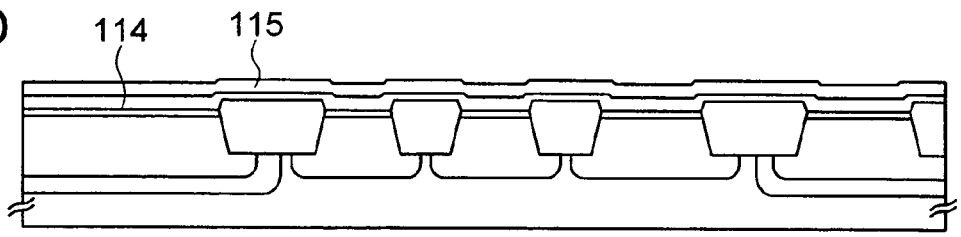

This was followed by 60 nm deposition of a phosphorus-doped polycrystalline Si film 114 which serves as an assist gate and 150 nm deposition of an $SiO_2$ film 115 (FIG. 7(d)).

Then, a thick $SiO_2$ film 115 and a polycrystalline Si film 114 were patterned by lithography and dry etching. ($SiO_2$ film 115 becomes 115a, and polycrystalline Si film 114 becomes 114a). By this operation, $SiO_2$ film 115 and polycrystalline Si film 114 in the peripheral circuit region were perfectly eliminated (FIG. 7(e)).

Figure 7F:
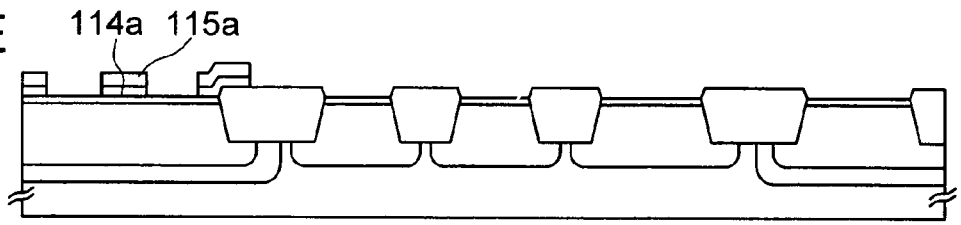

After forming a resist pattern with the memory cell region alone being left exposed by lithography (not shown), the source/drain diffusion layer region 116 of memory cell was formed by tilted ion implantation (FIG. 7(f)).

Figure 8A:
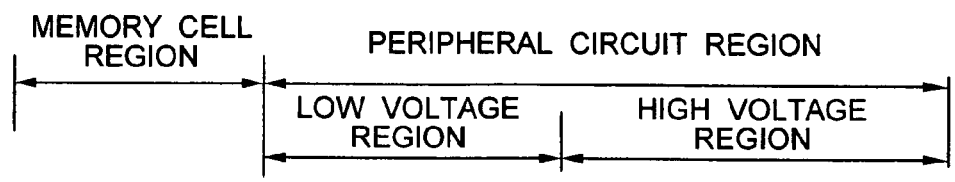
FIG. 8 is schematic sectional illustrations (2) of Example 2 of the present invention.
Figure 8B:
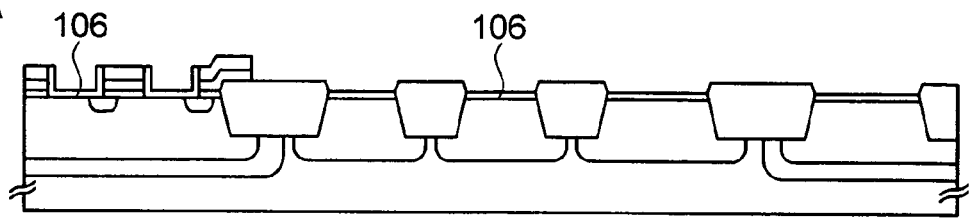
Figure 8C:
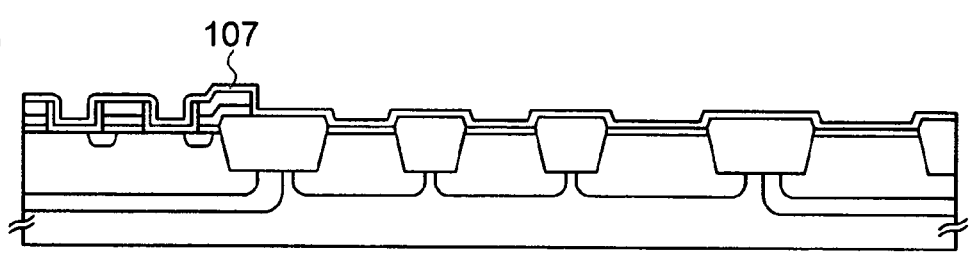
Figure 8D:
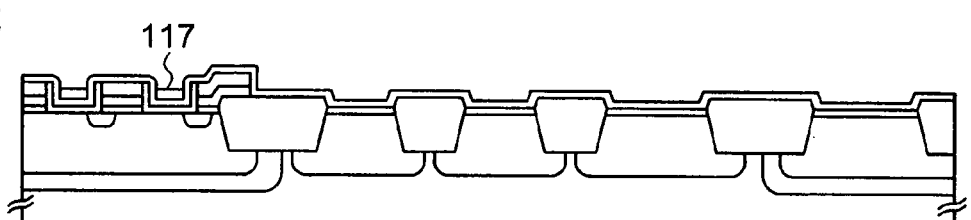
Figure 8E:
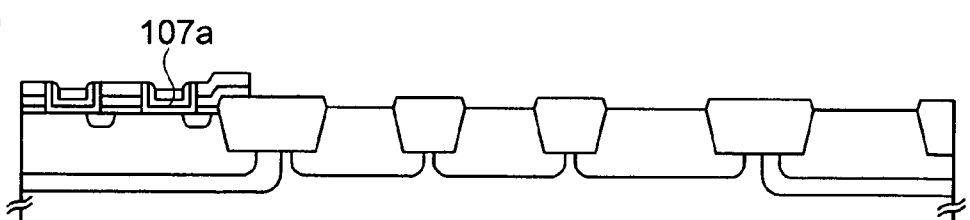
Figure 8F:
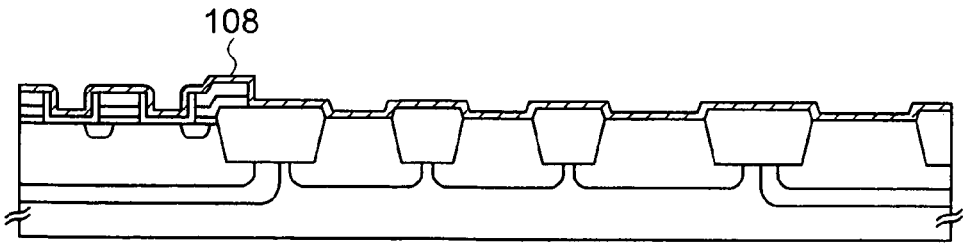

After removing gate oxide film 114 remaining in the peripheral circuit region (not shown), an $SiO_2$ film 106 which becomes a tunnel oxide film of memory cell was formed to a thickness of 9 nm (FIG. 8(e)).

Then, a phosphorus-doped polycrystalline Si film 107, which functions as a floating gate, was deposited to a thickness of, for example, 50 nm so that the space between the assist gate patterns would not be filled up (FIG. 8(b)).

A photoresist 117 was coated so that the space between the assist gate patterns would be perfectly filled up (not shown), and this was etched back, leaving the space between the assist gate patterns (FIG. 8(c)).

Then, the polycrystalline Si film 107 existing at the part not covered with photoresist 117 was removed by etch-back. (Polycrystalline Si film 107 becomes 107a). Etching was controlled so that the depth of etching would become slightly greater than the thickness of polycrystalline Si film 107 (FIG. 8(d)). According to this step, a floating gate pattern having a 3-dimensional shape can be formed by a single film forming operation.

Photoresist 117 remaining on polycrystalline Si film 107a was removed by ashing method (FIG. 8(e)).

Then, $SiO_2$ film 108 was deposited to a thickness of 16 nm at 750° C. by LPCVD using SiH4 and N2O as source gases. Immediately thereafter, $SiO_2$ film 108 was annealed in an NH3 atmosphere and subjected to wet oxidation (FIG. 8(f)).

A resist pattern was formed by lithography so that the high voltage region alone in the peripheral circuit region would be covered (not shown), and $SiO_2$ film 108 existing in the memory cell region and in the low voltage region of the peripheral circuit region was removed by a mixed aqueous solution of hydrogen fluoride and ammonia ($SiO_2$ film 108 becomes 108a) (FIG. 9(a)).

Then, $SiO_2$ film 109 was again deposited at 750° C. to a thickness of 11 nm by LPCVD using SiH4 and N2O as source gases, and immediately thereafter, $SiO_2$ film 109 was annealed in an NH3 atmosphere and further subjected to wet oxidation (FIG. 9(b)).

By the steps shown in FIG. 8(f) to FIG. 9(b), there are formed similarly to Example 1 a 11 nm thick interpoly dielectric film (CVD $SiO_2$ film 109) in the memory cell region, a 11 nm thick gate oxide film (CVD $SiO_2$ film 109) in the low voltage region of the peripheral circuit region, and an approximately 27 nm thick gate oxide film (laminate of CVD $SiO_2$ film 108a and CVD $SiO_2$ film 109) in the high voltage region of the peripheral circuit region.

Then, a phosphorus-doped polycrystalline Si film 110 designed to serve as a control gate of memory cell and gate electrodes of peripheral circuit was deposited (FIG. 9(c)).

This polycrystalline Si film 110 was patterned by a combination of lithography and dry etching to form control gate (word line) 110a of memory cell and gate electrodes 110b of peripheral circuit. Then, though not shown in the drawings, $SiO_2$ film 109 and polycrystalline Si film 107a in the memory cell region were etched to form floating gate ($SiO_2$ film 109 and polycrystalline Si film 107a become 109a and 107b, respectively) (FIG. 9(d)).

Then, source/drain regions 111b, 111c, 112a, 112b of peripheral circuit MOS transistors were formed (FIG. 9(e)).

Thereafter, though not shown in the drawings, an intermetal insulating film was deposited, and in this dielectric film contact holes connecting to word line 110a, gate electrodes 110b of peripheral MOS transistors and source/drain regions 112, 111 were formed. Then a metal film was deposited and patterned to form electrodes, thereby completing a nonvolatile semiconductor memory device.

According to Example 2 described above, as in the case of Example 1, improvement was provided to the characteristics and reliability of peripheral circuit MOS transistors of the nonvolatile semiconductor memory device. It was also possible to realize further miniaturizing of memory cells and lowering of operating voltage in comparison with Example 1. Further, two types of gate oxide films of peripheral circuit MOS transistors could be formed without increasing the number of the steps involved in the production process.

EXAMPLE 3

Example 3 concerns still another instance of attempt to realize further improvement of characteristics of peripheral circuit MOS transistors, miniaturizing of memory cells, lowering of operating voltage and simplification of the production process by using nitrogen-introduced CVD $SiO_2$ film for the interpoly dielectric films of both memory cells and peripheral circuit MOS transistors of the nonvolatile semiconductor memory device and by forming these films simultaneously.

The production procedure of the nonvolatile semiconductor memory device according to the instant Example is illustrated in FIGS. 10 to 12. The drawings shown are the sectional illustrations parallel to the word lines of memory cells and perpendicular to the gate lines of peripheral circuit MOS transistors. Example 3 is different from Example 1 in that it has a so-called AND structure in which source lines of memory cell array are separated and the cells are arranged in parallel.

The production process is described below.

Figure 10A:
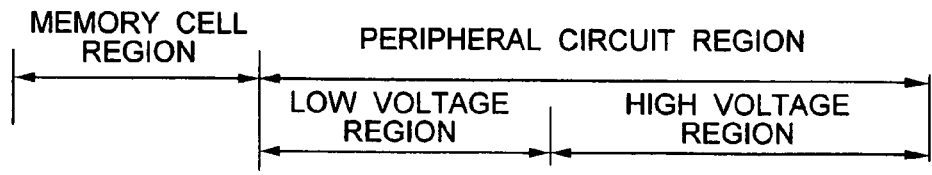
FIG. 10 is schematic sectional illustrations (1) of Example 3 of the present invention.

First, shallow groove isolation regions 102 separating peripheral circuit MOS transistors were formed on a p-type Si substrate 101 with surface orientation (100) (FIG. 10(a)).

Figure 10B:
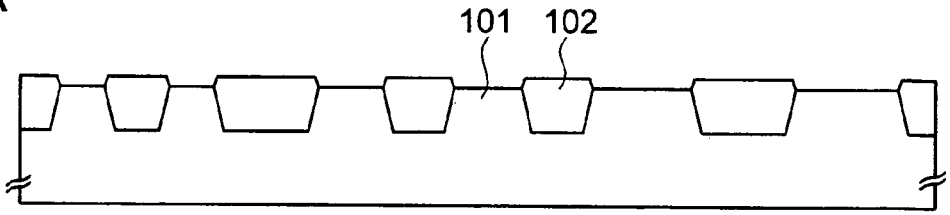

Then, P well regions 104a, 104b, 104c, N well regions 105a, 105b and well isolation regions 103 were formed by ion implantation method (FIG. 10(b)).

Figure 10C:
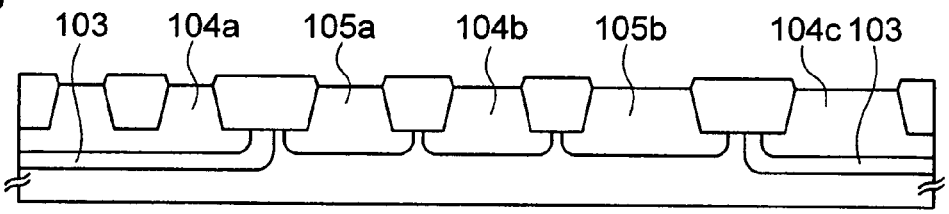

Then, $SiO_2$ film 106, which is to serve as tunnel oxide film of each memory cell, was formed to a thickness of 9 nm by thermal oxidation method (FIG. 10(c)).

Figure 10D:
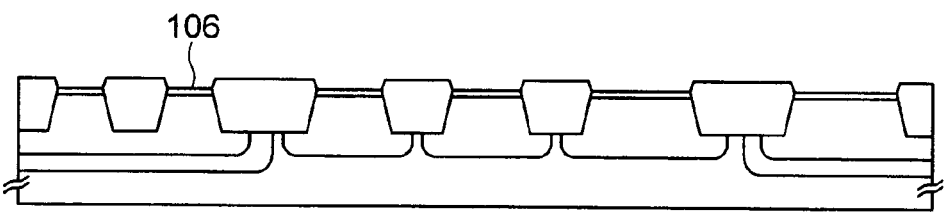

Thereafter, phosphorus-doped polycrystalline Si film 118 which is to function as first layer floating gate was deposited to a thickness of 100 nm (FIG. 10(d)).

Figure 10E:
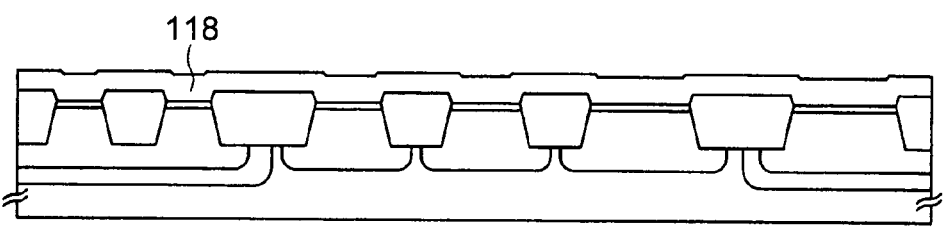
Figure 10E:
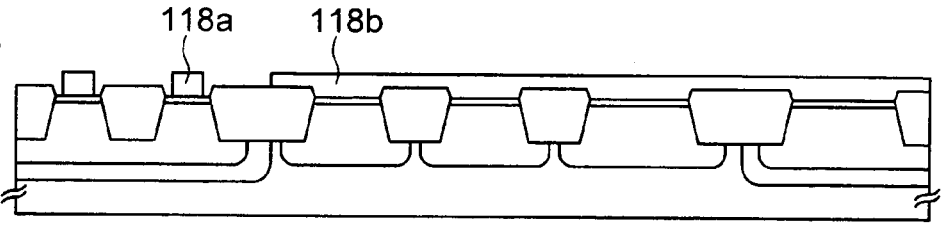

Then, polycrystalline Si film 118 was patterned by lithography and dry etching in such a manner that the Si film 118 in the peripheral circuit region would be left as it was (polycrystalline Si film 118 becomes 118a in the memory cell region and 118b in the peripheral circuit region) (FIG. 10(e)).

Next, source/drain diffusion regions 116 of memory cells were formed by ion implantation method (FIG. 10(f)).

Figure 11A:
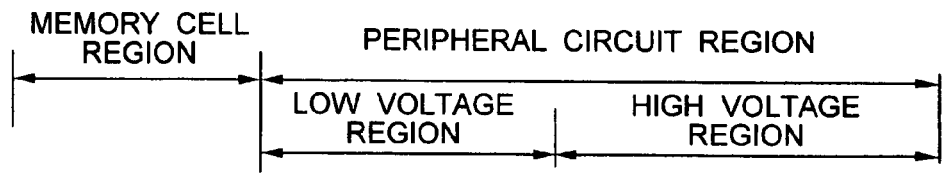
FIG. 11 is schematic sectional illustrations (2) of Example 3 of the present invention.

$SiO_2$ film 119 was deposited to a thickness of, for example, 400 nm so that the space between the first layer floating gates would be perfectly filled up (FIG. 11(a)).

Figure 11B:
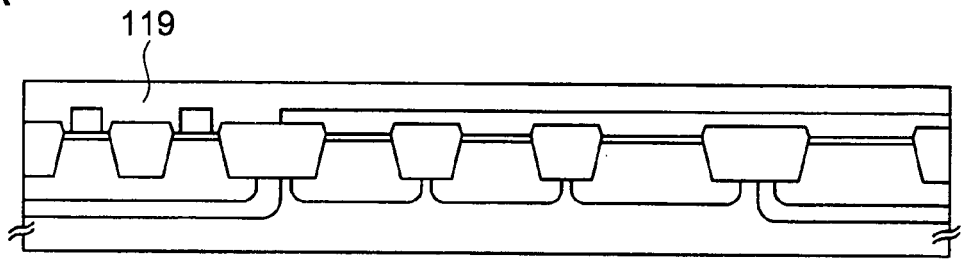

$SiO_2$ film 119 was polished by chemical mechanical polishing method (CMP) to expose the first layer floating gate patterns 118a and 118b (polycrystalline Si films 118a and 118b become 118c and 118d, respectively) (FIG. 11(b)).

Figure 11C:
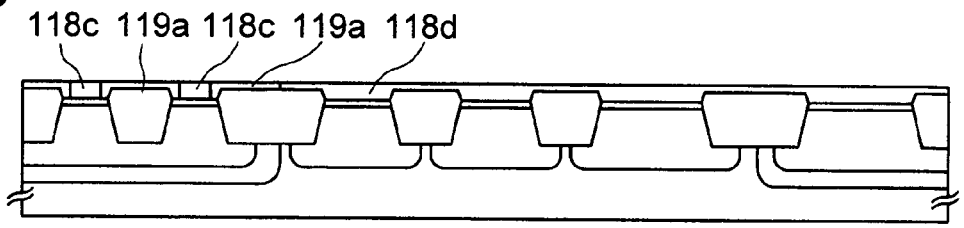
Figure 11D:
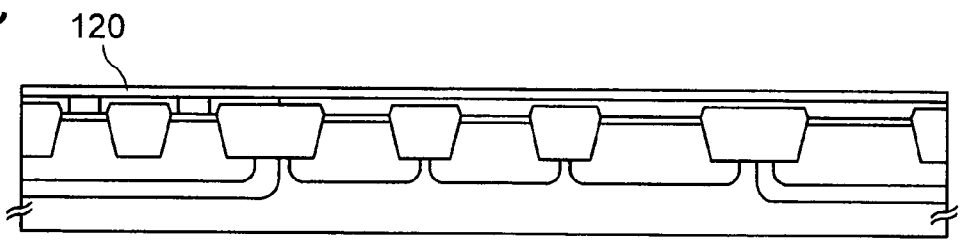

Then, phosphorus-doped polycrystalline Si film 120 which becomes second layer floating gate was deposited to a thickness of, for example, 50 nm (FIG. 11(c)).

Then, polycrystalline Si film 120 was patterned by lithography and dry etching (polycrystalline Si film 120 becomes 120a). By this operation, polycrystalline Si film 120 in the peripheral circuit region and polycrystalline Si film 118d existing thereunder were perfectly removed (FIG. 11(d)). In the memory cells of the nonvolatile semiconductor device according to the present Example, polycrystalline Si films 118c and 120a are electrically connected, and floating gate is formed by these two films.

Figure 11E:
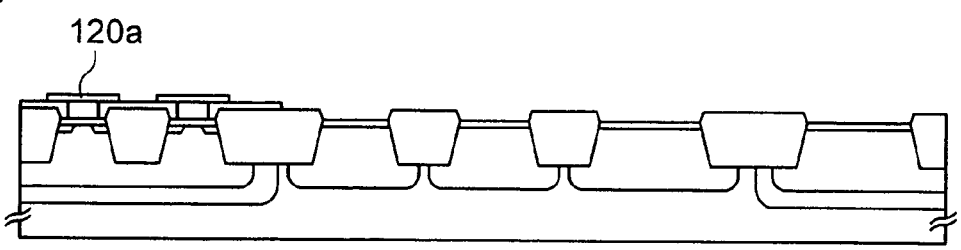

Then, $SiO_2$ film was deposited at 750° C. to a thickness of 16 nm by LPCVD using SiH4 and N2O as source gases, and immediately thereafter, $SiO_2$ film 108 was annealed in an NH3 atmosphere and subjected to wet oxidation (FIG. 11(e)).

Next, resist pattern was formed by lithography covering the high voltage region alone in the peripheral circuit region (not shown), and $SiO_2$ film 108 existing in the memory cell region and the peripheral circuit low voltage region was removed by a mixed aqueous solution of hydrogen fluoride and ammonia ($SiO_2$ film 108 becomes 108a) (FIG. 12(a)).

Then, $SiO_2$ film 109 was again deposited at 750° C. to a thickness of 11 nm by LPCVD using SiH4 and N2O as acting gases, and immediately thereafter, $SiO_2$ film 109 was annealed in an NH3 atmosphere and further subjected to wet oxidation (FIG. 12(b)).

Thus, by the steps shown in FIGS. 11(e) to 12(b), there are formed a 11 nm thick interpoly dielectric film (CVD $SiO_2$ film 109) in the memory cell region, a 11 nm thick gate oxide film (CVD $SiO_2$ film 109) in the peripheral circuit low voltage region, and an approximately 27 nm thick gate oxide film (laminate of CVD $SiO_2$ film 108a and CVD $SiO_2$ film 109) in the peripheral circuit high voltage region, as in Example 1.

Then, phosphorus-doped polycrystalline Si films 110 which are designed to become control gates of memory cells and gate electrodes of peripheral circuit region MOS transistors (FIG. 11(c)).

Thereafter, polycrystalline Si film 110 was patterned by lithography and dry etching to form control gate (word line) of memory cell and gate electrodes 110b of peripheral circuit. Then, though not shown, $SiO_2$ film 109 and polycrystalline Si films 120a, 118c in the memory cell region were etched to form floating gates ($SiO_2$ film 109 becomes 109a and polycrystalline Si films 120a and 118c become 120b and 118d, respectively) (FIG. 11(d)).

Then, source/drain regions 111b, 111c, 112a, 112b of peripheral circuit MOS transistors were formed (FIG. 11(e)).

Next, though not shown, an intermetal insulating film was deposited, and in this film contact holes connecting to word line 110a, gate electrodes 110b of peripheral circuit MOS transistors, and source/drain regions 112, 111 were formed, and then a metal film was deposited and patterned to form electrodes, thereby completing a nonvolatile semiconductor memory device.

According to Example 3 described above, like in Example 1, the characteristics and reliability of peripheral circuit MOS transistors of nonvolatile semiconductor memory device were improved. It was also possible to realize miniaturizing of the memory cells and lowering of operating voltage. Further, the two types of gate oxide films of peripheral circuit MOS transistors could be formed without increasing the number of the steps in the production process.

EXAMPLE 4

This Example concerns an embodiment in which a thin thermal oxide film is used in place of the nitrogen-introduced CVD $SiO_2$ film as part of the gate oxide films of MOS transistors in the peripheral circuit high voltage region.

The producing procedure of the nonvolatile semiconductor memory device of this Example is shown in FIG. 13. The steps until formation of floating gates 107a in the production procedure of this nonvolatile semiconductor device are the same as shown in FIGS. 1(a) to 1(e) of Example 1, so the explanation of these steps is not given here.

Figure 1E:
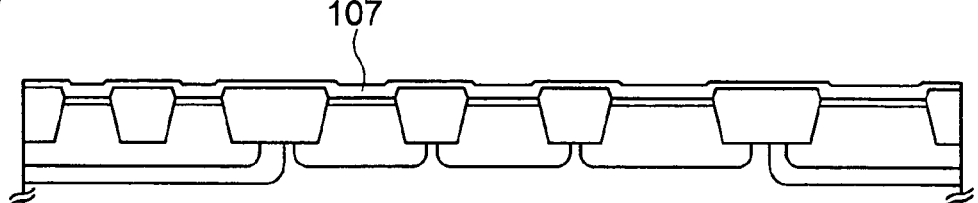
Figure 1F:
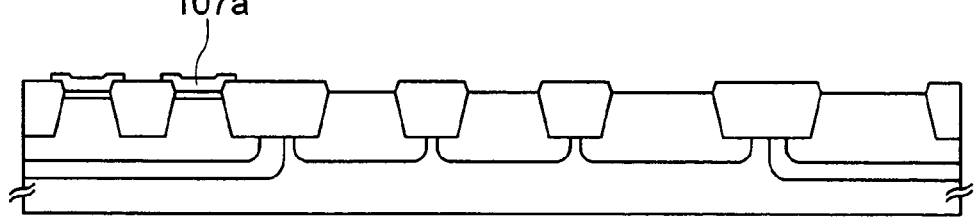
Figure 13A:
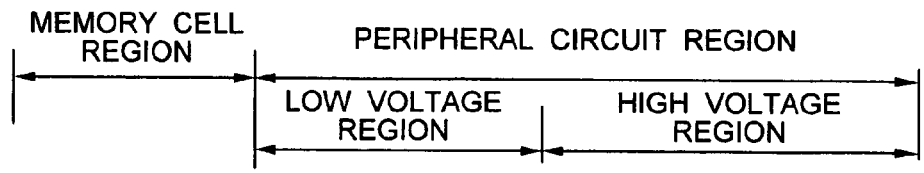
FIG. 13 is schematic sectional illustrations of Example 4 of the present invention.

After forming the floating gate patterns such as shown in FIG. 1(e), $SiO_2$ film 121 was deposited to a thickness of 4 nm by LPCVD using SiH4 and N2O as source gases (FIG. 13(a)).

Figure 13B:
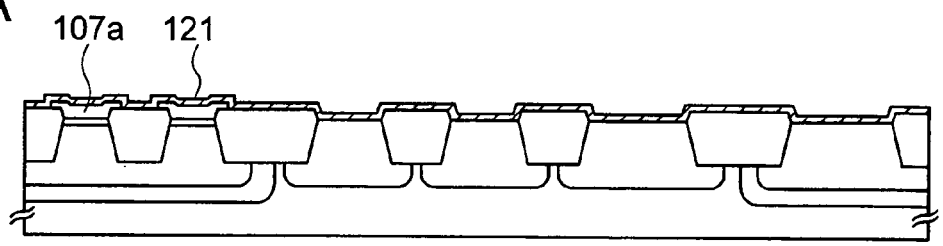
Figure 13C:
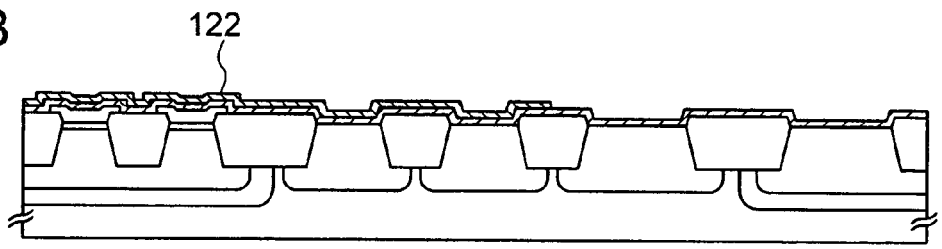
Figure 13D:
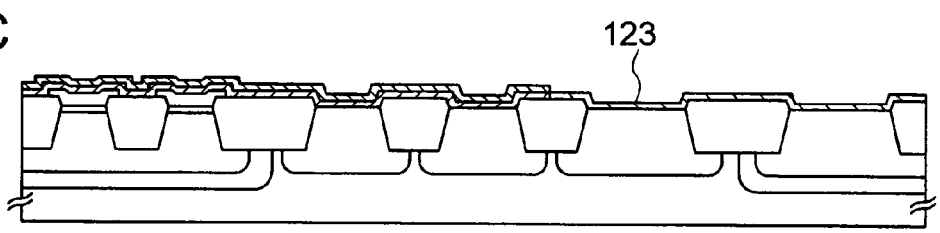

Then, Si3N4 film 122 was deposited to a thickness of 10 nm by LPCVD, after which resist pattern was formed by lithography in such a manner that the high voltage region alone of the peripheral circuit region would be exposed (not shown), and Si3N4 film 122 existing in the high voltage region was removed by dry etching (FIG. 13(b)).

After removing $SiO_2$ film 121 existing in the high voltage region with an aqueous hydrogen fluoride solution (not shown), $SiO_2$ film 123 was selectively grown only in the peripheral circuit high voltage region not covered with Si3N4 film 122 by thermal oxidation method. The formed oxide film thickness was 16 nm. Since said Si3N4 film 122 has oxidation resistance, the oxidation reaction does not proceed in the memory cell region and in the peripheral circuit low voltage region which are covered with Si3N4 film 122 (FIG. 13(c)).

After eliminating Si3N4 film 122 with a hot phosphoric acid aqueous solution, $SiO_2$ film 121 existing in the memory cell region and in the peripheral circuit low voltage region was removed with an aqueous hydrogen fluoride solution. In this operation, SiO$_2$ film 123 of the peripheral circuit high voltage region is also slightly etched at its surface, with its thickness being reduced to 14 nm (SiO$_2$ film 123 becomes 123a) (FIG. 13(d)).

Figure 13E:
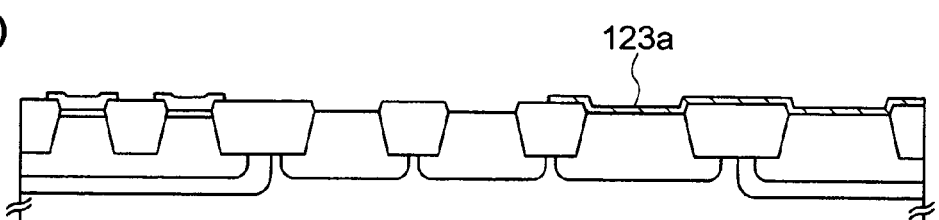

Then, SiO$_2$ film 109 was deposited at 750° C. to a thickness of 11 nm by LPCVD using SiH4 and N2O as source gases, and immediately thereafter, SiO$_2$ film 109 was annealed in an NH3 atmosphere and further subjected to wet oxidation (FIG. 13(e)).

By the above steps, there were formed a 11 nm thick interpoly dielectric film (CVD SiO$_2$ film 109) in the memory cell region, a 11 nm thick gate oxide film (CVD SiO$_2$ film 109) in the peripheral circuit low voltage region, and an approximately 25 nm thick gate oxide film (laminate of thermal oxidation SiO$_2$ film 123a and CVD SiO$_2$ film 109) in the peripheral circuit high voltage region.

Thereafter, the steps of FIGS. 2(c) to 2(e) of Example 1 were conducted to complete a nonvolatile semiconductor memory device.

In Example 4, it was possible to make a nonvolatile semiconductor memory device with the same number of masks as needed in Example 1 by using the thermal oxidation method. Also, the gate oxide film/Si substrate interfacial characteristics of MOS transistors in the peripheral circuit high voltage region were improved and the conductance enhanced in comparison with Example 1.

In Example 4, the gate oxide film of MOS transistors in the peripheral circuit high voltage region is constituted by a thermal oxidation film and a nitrogen-introduced CVD SiO$_2$ film. Due to thermal oxidation, there was observed a slight decrease of gate oxide film thickness, such as shown in FIG. 5(a), at the part contiguous to the shallow groove isolation region. However, since the oxide film thickness was small (14 nm) as compared to the prior art film, the degradation of current-voltage characteristics and breakdown voltage of MOS transistors was limited to a level that posed no practical problem.

EXAMPLE 5

As stated in Example 4, even when thermal oxidation film is used as gate oxide film of peripheral circuit MOS transistors, the degree of thinning of the oxide film at the part contiguous to the shallow groove isolation region is small and the degradation of MOS characteristics can be restricted to a level that presents no practical problem if the oxide film thickness is small. So, in this Example is described the instance where the thinned thermal oxidation film was used as gate oxide film of low voltage MOS transistors in the peripheral circuit region to improve performance of the nonvolatile semiconductor memory device.

The production procedure of the nonvolatile semiconductor memory device according to the instant Example is illustrated in FIGS. 14 to 15. Since the steps until formation of the well regions are the same as those of Example 1 illustrated in FIGS. 1(a) to 1(b), they are not explained here.

Figure 14A:
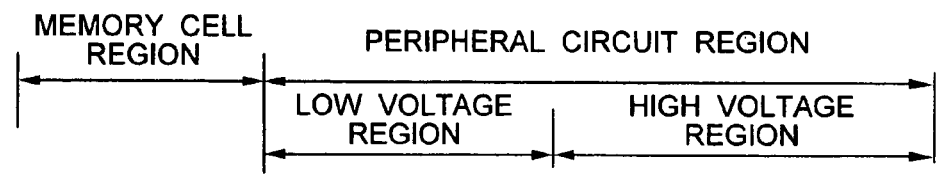
FIG. 14 is schematic sectional illustrations (1) of Example 5 of the present invention.

After forming the isolation regions and the well regions as illustrated in FIGS. 1(a) to 1(b) of Example 1, SiO$_2$ film which becomes tunnel dielectric film of memory cells was formed by thermal oxidation method (FIG. 14(a)).

Figure 14B:
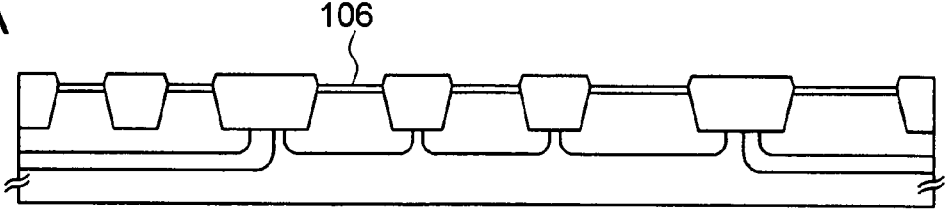

Then, a resist pattern designed to leave the low voltage region alone in the peripheral circuit region exposed was formed by lithography (not shown), and SiO$_2$ film 106 in the low voltage region was removed by a mixed aqueous solution of hydrogen fluoride and ammonia (FIG. 14(b)).

Figure 14C:
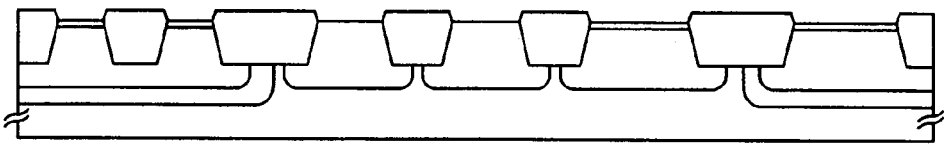

Then, SiO$_2$ film 124 which becomes gate oxide film of MOS transistors in the peripheral circuit low voltage region was formed to a thickness of 5 nm by thermal oxidation method (FIG. 14(c)).

Figure 14D:
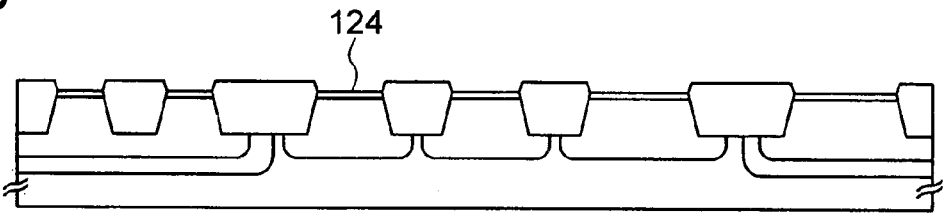
Figure 14E:
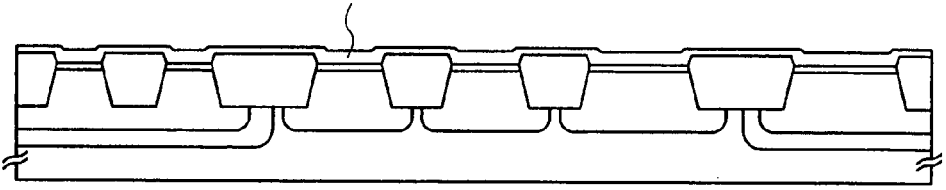

Then, phosphorus-doped polycrystalline Si film 107 which becomes floating gate was deposited to a thickness of 150 nm (FIG. 14(d)).

Thereafter, polycrystalline Si film 107 was patterned by lithography and dry etching. In this operation, polycrystalline Si film 107 in the peripheral circuit region was perfectly removed in the high voltage region, but was left so that it would be entirely covered in the low voltage region (polycrystalline Si film 107 becomes 107a and 107c) (FIG. 14(e)).

Figure 14F:
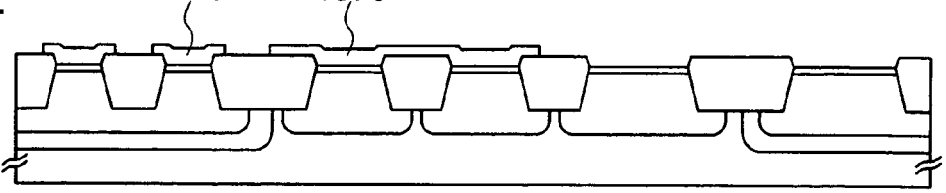

Next, SiO$_2$ film 108 was deposited at 750° C. to a thickness of 16 nm by LPCVD using SiH4 and N2O as source gases, and immediately thereafter, SiO$_2$ film 108 was annealed in an NH3 atmosphere and subjected to wet oxidation (FIG. 14(f)).

Then, a resist pattern was formed by lithography covering SiO$_2$ film 108 in the high voltage region alone of the peripheral circuit region (not shown), and SiO$_2$ film 108 present in the memory cell region and in the peripheral circuit low voltage region was removed by a mixed aqueous solution of hydrogen fluoride and ammonia (SiO$_2$ film 108 becomes 108a) (FIG. 15(a)).

Then, SiO$_2$ film 109 was again deposited at 750° C. to a thickness of 11 nm by LPCVD using SiH4 and N2O as source gases, immediately followed by annealing of SiO$_2$ film 109 in an NH3 atmosphere and wet oxidation (FIG. 15(b)).

By the above steps, there are formed a 11 nm thick interpoly dielectric film (CVD SiO$_2$ film 109) in the memory cell region, a 5 nm thick gate oxide film (thermally oxidized SiO$_2$ film 124) in the peripheral circuit low voltage region, and an approximately 27 nm thick gate oxide film (laminate of CVD SiO$_2$ film 108a and CVD SiO$_2$ film 109) in the peripheral circuit high voltage region.

Then, phosphorus-doped polycrystalline Si film 110 which forms memory cell control gates and peripheral circuit gate electrodes was deposited (FIG. 15(c)).

Then, polycrystalline Si film 110 was patterned by lithography and dry etching to form memory cell control gate (word line) 110a and peripheral circuit gate electrodes 110b. Thereafter, though not shown, SiO$_2$ film 109 and polycrystalline Si films 107a, 107c of the memory cell region and of MOS transistors in the peripheral circuit low voltage region are etched, thereby completing the floating gates (SiO$_2$ film 109 becomes 109a and polycrystalline Si films 107a and 107c become 107b and 107d, respectively). Here, patterning was conducted so that part of polycrystalline Si films 107d in the peripheral circuit low voltage region would be exposed (FIG. 15(d)).

Next, source/drain regions 111b, 111c, 112a, 112b of memory cells and peripheral circuit MOS transistors (source/drain regions of memory cells being not shown) were formed by ion implantation method, after which, though not shown, an intermetal insulating film was deposited, and in this film contact holes connecting to word line 110a, gate electrodes 110b of peripheral circuit MOS transistors and source/drain regions 112, 111 were formed. Then, a metal film was deposited and patterned to form electrodes. In this operation, contact holes and metal electrodes are so disposed that polycrystalline Si films 110b and 107d would be electrically connected to each other in the peripheral circuit low voltage region. By this arrangement, in the MOS transistors in the peripheral circuit low voltage region, the voltage applied to polycrystalline Si film 110b is also applied to 107d. By carrying out the above process, a nonvolatile semiconductor memory device was completed (FIG. 15(e)).

The nonvolatile semiconductor memory device produced according to Example 5, like that of Example 1, was improved in characteristics and reliability of peripheral circuit MOS transistors. It was also possible to realize miniaturizing of memory cells and a reduction of operating voltage. Further, gate oxide films of peripheral circuit MOS transistors could be reduced to two types without increasing the number of the steps. Moreover, as compared to Example 1, high-speed operation of the peripheral circuit low voltage region was made possible, and programming/erasing and reading speed was improved.

EXAMPLE 6

Described here is still another instance of attempt to improve performance of nonvolatile semiconductor memory device by using a laminate of a thinned thermal oxide film and a nitrogen-introduced CVD $SiO_2$ film as gate oxide film of MOS transistors in the high voltage region of the peripheral circuit region.

The production procedure of the nonvolatile semiconductor memory device of Example 6 is illustrated in FIGS. 16 to 17. The steps until formation of the well regions are the same as those illustrated in FIGS. 1(a) to 1(b) of Example 1 and therefore need not be explained here.

Figure 16A:
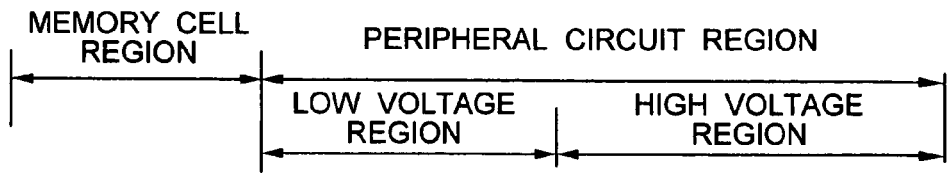
FIG. 16 is schematic sectional illustrations (1) of Example 6 of the present invention.

After forming the isolation regions and the well regions as illustrated in FIGS. 1(a) to 1(b) of Example 1, $SiO_2$ film 125 was deposited at 750° C. to a thickness of 20 nm by LPCVD using SiH4 and $N_2O$ as source gases, and immediately thereafter, $SiO_2$ film 108 was annealed in an NH3 atmosphere and further subjected to wet oxidation (FIG. 16(a)).

Figure 16B:
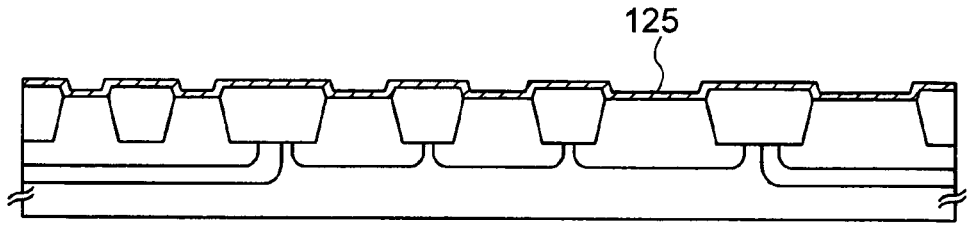

Then, a resist pattern designed to cover the high voltage section alone of the peripheral circuit region was formed by lithography (not shown), and $SiO_2$ film 125 in the memory cell region and the low voltage region of the peripheral circuit region was removed by a mixed aqueous solution of hydrogen fluoride and ammonia ($SiO_2$ film 125 becomes 125a) (FIG. 16(b)).

Next, $SiO_2$ film 126 designed to constitute tunnel dielectric film and gate oxide film in the peripheral circuit low voltage region was formed to a thickness of 9 nm by thermal oxidation method. In this operation, oxide film 126a grows in the peripheral circuit high voltage region, too, although its growth is not equal to that in the memory cell region.

Figure 16C:
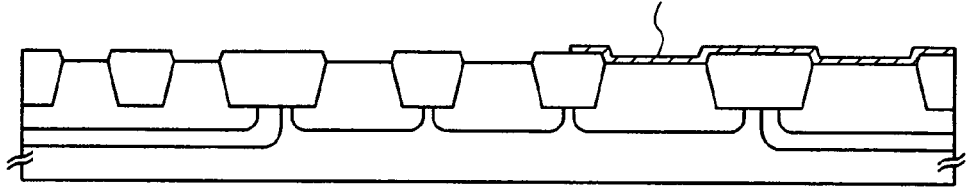

By the above steps, there are formed a 9 nm tunnel dielectric film (thermal oxidation $SiO_2$ film 126) in the memory cell region, a 9 nm gate oxide film (thermal oxidation $SiO_2$ film 126) in the peripheral circuit low voltage region, and a roughly 27 nm gate oxide film (laminate of thermal oxidation $SiO_2$ film 126a and CVD $SiO_2$ film 125a) in the peripheral circuit high voltage region (FIG. 16(c)).

Figure 16D:
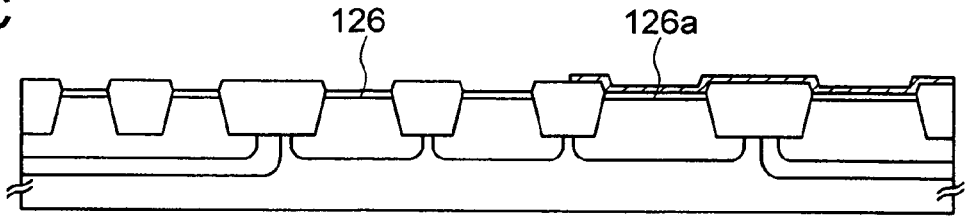
Figure 16E:
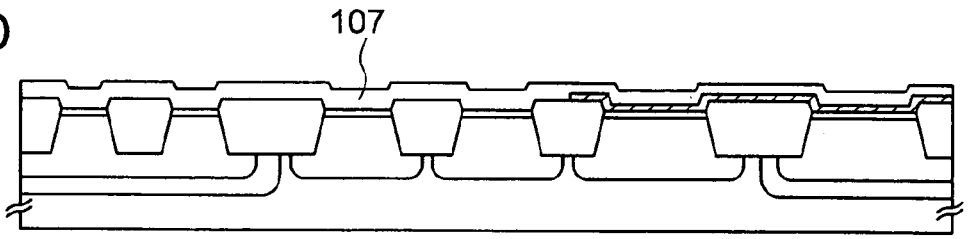

Then, phosphorus-doped polycrystalline Si film 107, which becomes floating gate, was deposited to a thickness of 150 nm (FIG. 16(d)).

Thereafter, polycrystalline Si film 107 was patterned by lithography and dry etching. In this operation, polycrystalline Si film 107 in the peripheral circuit region was left in such a way that it would be entirely covered (polycrystalline Si film 107 becomes 107a in the memory cell region and 107e in the peripheral circuit region) (FIG. 16(e)).

Figure 17A:
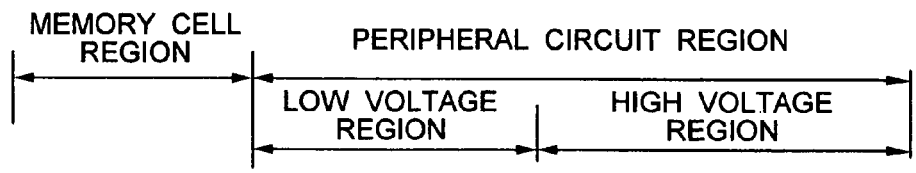
FIG. 17 is schematic sectional illustrations (2) of Example 6 of the present invention.

Then, $SiO_2$ film 109, which is to serve as interpoly dielectric film, was deposited at 750° C. to a thickness of 11 nm by LPCVD using SiH4 and N2O as source gases, and immediately thereafter, $SiO_2$ film 109 was annealed in an NH3 atmosphere and further subjected to wet oxidation (FIG. 17(a)).

Figure 17B:
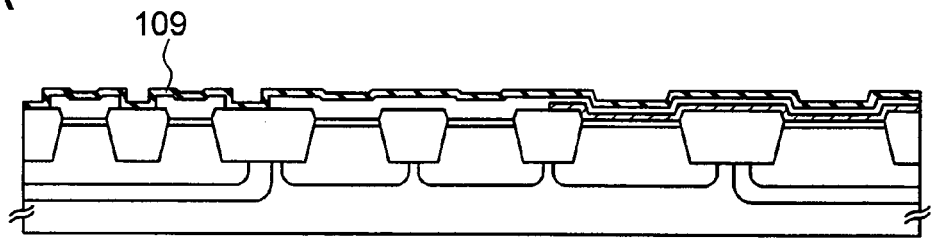
Figure 17C:
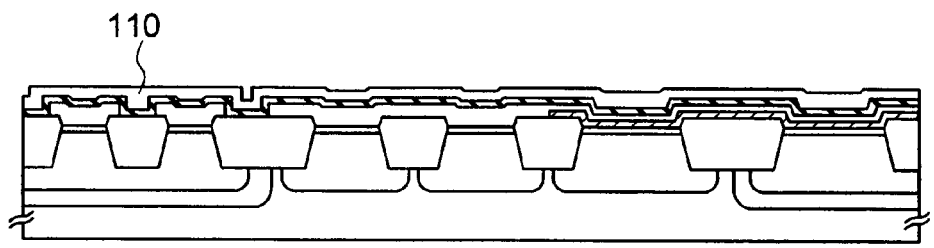
Figure 17D:
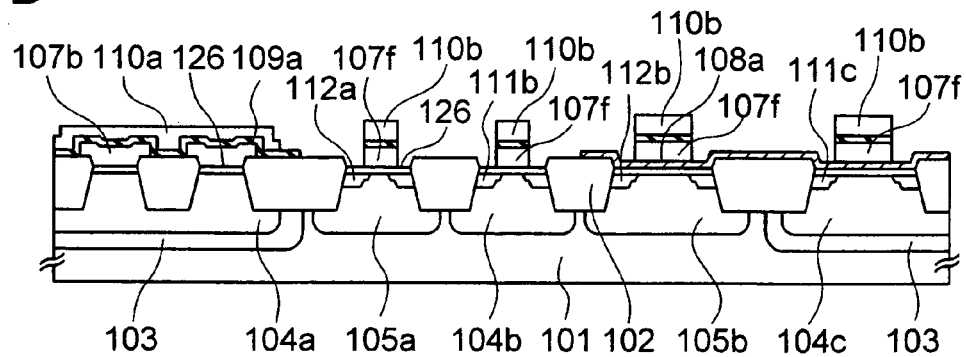
Figure 18:
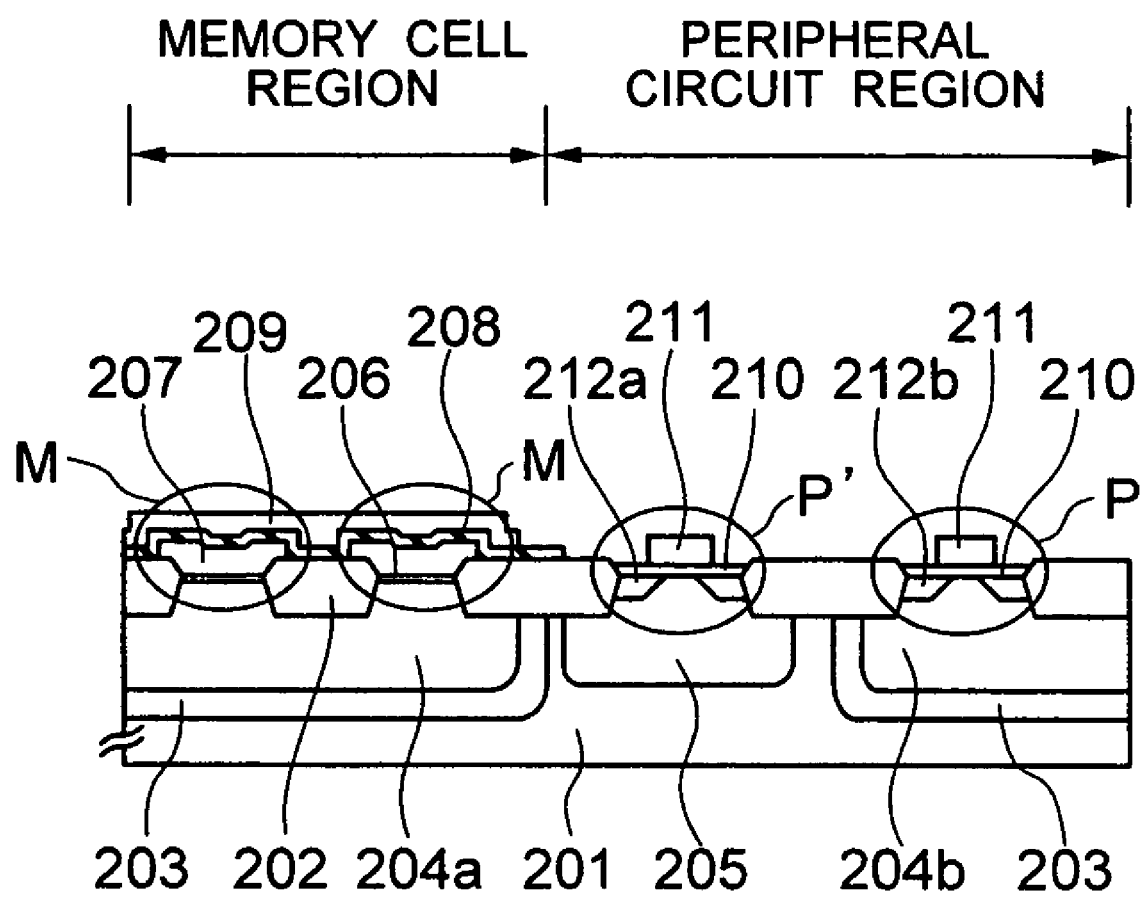
FIG. 18 is a schematic sectional illustration of the prior art.

Next, phosphorus-doped polycrystalline Si film 110, which is to form memory cell control gates and peripheral circuit gate electrodes, was deposited (FIG. 17(b)).

Thereafter, polycrystalline Si film 110 was patterned by lithography and dry etching to form memory cell control gates (word lines) 110a and peripheral circuit gate electrodes 110b, and then, though not shown, $SiO_2$ film 109 and polycrystalline Si films 107a, 107e in the memory cell region and of MOS transistors in peripheral circuit region were etched, thereby completing the floating gates ($SiO_2$ film 109 becomes 109a and polycrystalline Si films 107a and 107c become 107b and 107f, respectively). Patterning was conducted so that part of polycrystalline Si films 107d in the peripheral circuit region would be exposed (FIG. 17(c)).

Next, source/drain regions 111b, 111c, 112a, 112b of memory cells and peripheral circuit region MOS transistors (source/drain regions of memory cells being not shown) were formed by ion implantation method. Then, though not shown, an intermetal insulating film was deposited, and in this intermetal insulating film contact holes connecting to word lines 110a, gate electrodes 110b of peripheral circuit region MOS transistors, and source/drain regions 112, 111 were formed. Then a metal film was deposited and patterned to form electrodes. In this operation, in the peripheral circuit region, contact holes and metal electrodes were so disposed that polycrystalline Si films 110b and 107d would be electrically connected. By this arrangement, in MOS transistors in the peripheral circuit region, the voltage applied to polycrystalline Si film 110b is also applied to polycrystalline Si film 107d. By the above process, a nonvolatile semiconductor memory device was completed (FIG. 17(d)).

The nonvolatile semiconductor memory device of this Example, like that of Example 1, was improved in characteristics and reliability of MOS transistors in the peripheral circuit region. It was also possible to realize miniaturization of memory cells and lowering of operating voltage. Further, two types of gate oxide films of peripheral circuit MOS transistors could be formed without increasing the number of the steps. Still further, high-speed operation of peripheral circuit low voltage region was made possible and programming/erasing and reading speed was enhanced in comparison with Example 1.

In the above Examples, the invention has been described concerning its embodiments using NOR type, assist gate type and AND type memory cells, but the similar effect can be obtained by using other types of memory cells, such as NAND type, split gate type and erase gate type.

The same effect can also be obtained when the invention is applied to a product in which nonvolatile semiconductor memory device and microcontroller are embedded in a single chip.

(Effect of the Invention)

According to the present invention, reliability of gate oxide films of peripheral circuit region MOS transistors and transistor characteristics of nonvolatile semiconductor memory device are improved. It is also possible to realize miniaturizing of the nonvolatile semiconductor memory device and lowering of its operating voltage. Further, the production process of this nonvolatile semiconductor memory device can be simplified.

What is claimed is:

1. A process for producing a nonvolatile semiconductor memory device comprising a plurality of memory cells each having a floating gate formed on a semiconductor substrate with the interposition of a tunnel dielectric film and a control gate formed on said floating gate with the interposition of an interpoly dielectric film, and a plurality of field effect transistors each having gate electrodes formed on the semiconductor substrate with the interposition of a gate insulating film, said process comprising the steps of:
   forming a shallow groove isolation region on a semiconductor substrate;
   forming a tunnel dielectric film on the semiconductor substrate surface in said memory cell formed region by thermal oxidation method,
   depositing a first polycrystalline Si film which becomes said floating gate, and then removing the first polycrystalline Si film in said field effect transistor formed region;
   depositing a first silicon oxide film which becomes the first portion of said gate insulating film, and then removing the first silicon oxide film in said memory cell formed region;
   depositing a second silicon oxide film which becomes said interpoly dielectric film and a second portion of said gate insulating film; and
   depositing a second polycrystalline Si film which becomes said control gate and said gate electrodes.

2. The process according to claim 1 wherein in the fourth and fifth steps, the first and second silicon oxide films just after deposition are annealed in an NH3 atmosphere and further subjected to wet oxidation.

3. The process according to claim 1 wherein in the third and sixth steps, the first and second polycrystalline Si films are doped with phosphorus.

4. A process for producing a nonvolatile semiconductor memory device comprising a plurality of memory cells each having a floating gate formed on a semiconductor substrate with the interposition of a tunnel dielectric film and a control gate formed on said floating gate with the interposition of an interpoly dielectric film, and a plurality of field effect transistors each having gate electrodes formed on the semiconductor substrate with the interposition of a gate insulating film, said process comprising the steps of:
   forming a shallow groove isolation region on the semiconductor substrate;
   forming a tunnel dielectric film on the semiconductor substrate surface in the memory cell formed region by thermal oxidation method;
   depositing a first polycrystalline Si film which becomes said floating gate, and then removing the first polycrystalline Si film in said field effect transistor formed region;
   forming a first silicon oxide film, which becomes a first portion of said gate insulating film, on the semiconductor substrate surface in the field effect transistor formed region by thermal oxidation method;
   depositing a second silicon oxide film which becomes said interpoly dielectric film and a second portion of said gate insulating film; and
   depositing a second polycrystalline Si film which becomes said control gate and said gate electrodes.

5. The process according to claim 4 wherein in the fifth step, the second silicon oxide film just after its deposition is annealed in an NH$_3$ atmosphere and further subjected to wet oxidation.

6. A process according to claim 4, wherein said second silicon oxide film is formed over said first silicon oxide film so that said gate insulating film comprises a laminated film of said second portion formed over said first portion.

7. The process according to claim 4 wherein in the third and sixth steps, the first and second polycrystalline Si films are doped with phosphorus.

8. A process according to claim 7, wherein said second silicon oxide film is formed over said first silicon oxide film so that said gate insulating film comprises a laminated film of said second portion formed over said first portion.

9. A process for producing a nonvolatile semiconductor memory device comprising a plurality of memory cells each having a floating gate formed on a semiconductor substrate with the interposition of a tunnel dielectric film and a control gate formed on said floating gate with the interposition of an interpoly dielectric film, and a plurality of field effect transistors each having gate electrodes formed on the semiconductor substrate with the interposition of a gate insulating film, said process comprising the steps of:
   forming a shallow groove isolation region on a semiconductor substrate;
   depositing a first silicon oxide film which becomes a first portion of said gate insulating film, and then removing said first silicon oxide film in the memory cell formed region;
   forming a tunnel dielectric film on the semiconductor substrate surface in the memory cell formed region and forming a second silicon oxide film which becomes a second portion of said gate insulating film between said semiconductor substrate in the transistor formed region and said first silicon oxide film, both by thermal oxidation method;
   depositing a first polycrystalline Si film which becomes said floating gate and said gate electrodes;
   depositing a third silicon oxide film which becomes said interpoly dielectric film; and
   depositing a second polycrystalline Si film which becomes said control gate.

10. The process according to claim 9 wherein in the second and fifth steps, the first and third silicon oxide films immediately after their deposition are annealed in an NH$_3$ atmosphere and further subjected to wet oxidation.

11. The process according to claim 9 wherein in the fourth and sixth steps, the first and second polycrystalline Si films are doped with phosphorus.

* * * * *